(12) United States Patent
    Sada et al.

(10) Patent No.: US 12,671,407 B2
(45) Date of Patent: Jun. 30, 2026

(54) SEMICONDUCTOR DEVICE, ELECTRONIC APPARATUS AND VEHICLE

(71) Applicant: ROHM CO., LTD., Kyoto (JP)

(72) Inventors: Makoto Sada, Kyoto (JP); Katsuaki Yamada, Kyoto (JP); Shuntaro Takahashi, Kyoto (JP); Toru Takuma, Kyoto (JP); Naoki Takahashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 115 days.

(21) Appl. No.: 18/885,982

(22) Filed: Sep. 16, 2024

(65) Prior Publication Data

US 2025/0105834 A1    Mar. 27, 2025

(30) Foreign Application Priority Data

Sep. 21, 2023    (JP) ................................. 2023-155548

(51) Int. Cl.
    *H03K 17/00*        (2006.01)
    *H03K 17/082*        (2006.01)

(52) U.S. Cl.
    CPC . *H03K 17/0822* (2013.01); *H03K 2217/0027* (2013.01); *H03K 2217/0045* (2013.01); *H03K 2217/0072* (2013.01)

(58) Field of Classification Search
    CPC ...... H03K 17/12; H03K 17/122; H03K 17/56; H03K 17/687; H03K 17/6871; H03K 17/6872; H03K 17/0822; H03K 2217/0027; H03K 2217/0045; H03K 2217/0072
    See application file for complete search history.

(56) References Cited

U.S. PATENT DOCUMENTS

| | | | |
|---|---|---|---|
| 12,283,947 B2 * | 4/2025 | Yamada | H03K 17/687 |
| 2019/0286181 A1 * | 9/2019 | Iwamizu | H10D 84/811 |
| 2023/0133872 A1 * | 5/2023 | Takuma | H03K 17/0822 |
| | | | 323/282 |
| 2024/0146193 A1 * | 5/2024 | Fukushima | H02M 3/158 |
| 2025/0141443 A1 * | 5/2025 | Kwak | H03K 17/102 |

FOREIGN PATENT DOCUMENTS

WO    WO 2017/187785    11/2017

* cited by examiner

*Primary Examiner* — Tuan T Lam
(74) *Attorney, Agent, or Firm* — Fish & Richardson P.C.

(57) ABSTRACT

The present disclosure provides a semiconductor device. The semiconductor device includes: a semiconductor substrate; a well, formed in the semiconductor substrate; an output terminal, electrically connected to the semiconductor substrate; a ground terminal, configured to receive a ground voltage; a detection signal generating circuit, configured to generate a negative current detection signal when an output voltage present at the output terminal is detected to be less than the ground voltage; and a control circuit, configured to apply the ground voltage or the output voltage to the well in response to the negative current detection signal. The detection signal generating circuit includes: a comparator, configured to generate the negative current detection signal by comparing an output detection voltage with the ground voltage or the threshold voltage; a bias circuit, configured to switch between applying the output voltage or a bias voltage as the output detection voltage; and a clamp circuit.

10 Claims, 19 Drawing Sheets

SEMICONDUCTOR DEVICE, ELECTRONIC APPARATUS AND VEHICLE

TECHNICAL FIELD

The present disclosure relates to a semiconductor device, and an electronic apparatus and a vehicle using the semiconductor device.

BACKGROUND

So far the applicant has proposed numerous new techniques (for example, referring to patent publication 1) for semiconductor devices (for example, high-side switch large-scale integration (LSI)) or low-side switch LSI) such as in-vehicle intelligent power devices (IPD).

PRIOR ART DOCUMENT

Patent Publication

[Patent publication 1] International Publication No. 2017/187785

DETAILED DESCRIPTION OF THE EMBODIMENTS

<Semiconductor Device>

Figure 1:
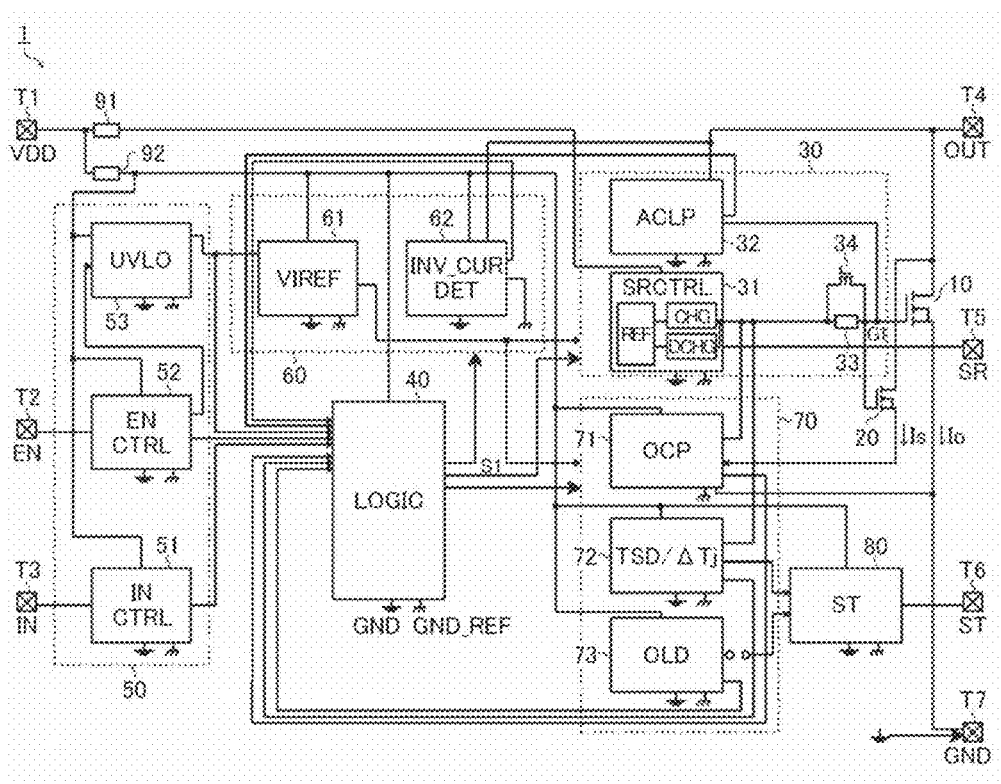
FIG. 1 is a diagram of an overall configuration of a semiconductor device.

FIG. 1 shows a diagram of an overall configuration of a semiconductor device. A semiconductor device 1 of this configuration example is an in-vehicle low-side switch large-scale integration (LSI, namely one of the automotive Intelligent Power Devices) that connects/disconnects a load to/from a ground end according to an external control signal IN and an external enable signal EN output from an electronic control unit (ECU) (not shown).

The semiconductor device 1 includes external terminals T1 to T7 which are used as mechanisms for asserting external electrical connections with the device. The external terminal T1 is used as a power supply terminal for receiving a supply of a power supply voltage VDD. The external terminals T2 and T3 respectively are signal input terminals for receiving external inputs of the external enable signal EN and the external control signal IN. The external terminal T4 is a load connection terminal for externally connecting to a load (a light bulb, a relay coil, a solenoids, an LED or an electric motor). Moreover, the terminal T4 can also be understood as an output terminal to which an output voltage OUT is applied. The external terminal T5 is a slew rate adjustment terminal for receiving an external input of a slew rate adjustment signal SR. The external terminal T6 is a signal output terminal for externally outputting a state signal ST. The external terminal T7 is a ground terminal.

Moreover, with reference to this drawing, the semiconductor device 1 is formed by integrating a power transistor 10 (for example, an N-channel type metal oxide semiconductor field effect transistor (NMOSFET)), a sensing transistor 20 (for example, an NMOSFET), a gate control system 30, a logic device 40, an input system 50, a reference system 60, a protection system 70, a state output section 80, and current limiting resistors 91 and 92.

A drain of the power transistor 10 is connected to the external terminal T4. A source of the power transistor 10 is connected to the external terminal T7. A gate of the power transistor 10 is connected to an application terminal of a gate driving signal G1. The power transistor 10 connected as above functions as a low-side switch element for connecting/disconnecting a current path of an output current Io from the external terminal T4 to the external terminal T7. Moreover, the power transistor 10 is turned on when the gate driving signal G1 is at a high level and is turned off when the gate driving signal G1 is at a low level. Moreover, the power transistor 10 is designed so that an on resistance Ron becomes several tens of mΩ.

The sensing transistor 20 is a current detection element of which a gate and a drain are commonly connected to the power transistor 10. The sensing transistor 20 generates a sensing current Is corresponding to the output current Io flowing through the power transistor 10. The power transistor 10 and the sensing transistor 20 have a size ratio of m:1 (where m>1). Thus, the sensing current Is becomes a magnitude that reduces the output current Io to 1/m. Moreover, similar to the power transistor 10, the sensing transistor 20 is turned on when the gate driving signal G1 is at a high level and is turned off when the gate driving signal G1 is at a low level.

The gate control system 30 generates the gate driving signal G1 according to a gate control signal S1 from the logic device 40, and controls on/off of the power transistor 10 and the sensing transistor 20. For example, the gate control system 30 includes a slew rate control circuit 31, an active clamp circuit 32, a gate resistor 33 and a transistor 34 (an NMOSFET in this drawing).

The slew rate control circuit 31 receives a supply of the power supply voltage VDD from the external terminal T1 along a path via the current limiting resistor 91 and operates accordingly. The slew rate control circuit 31 includes, for example, a reference current source REF, a charging section CHG and a discharging section DCHG. The reference current source REF generates a reference current Iref corresponding to the slew rate adjustment signal SR externally input to the external terminal T5. The charging section CHG generates a charging current Ichg corresponding to the reference current Iref. The discharging section DCHG generates a discharging current Idchg corresponding to the reference current Iref. The slew rate control circuit 31 generates the gate driving signal G1 by charging/discharging control corresponding to the gate control signal S1.

The active clamp circuit 32 is connected between the external terminal T4 and the gate of the power transistor 10. In an application where an inductive load is connected to the external terminal T4, the output voltage OUT becomes a negative voltage (OUT<GND) due to a back electromotive force of the load when the power transistor 10 is switched from on to off. Thus, the active clamp circuit 32 is provided in order to absorb energy. The active clamp circuit 32 keeps the power transistor 10 from a full-disconnection while the power transistor 10 transitions to off and thus limits a drain-source voltage (equivalent to the output voltage OUT) of the power transistor 10 to be less than an active clamp voltage VCLP.

The gate resistor 33 is connected between an output terminal of the slew rate control circuit 31 and the gate (equivalent to an application terminal of the gate driving signal G1) of the power transistor 10.

The transistor 34 is connected in parallel to the gate resistor 33. The transistor 34 can also perform on/off control according to the slew rate adjustment signal SR, for example.

The logic device 40 receives a supply of the power supply voltage VDD from the external terminal T1 along a path via the current limiting resistor 92 and operates accordingly. The logic device 40 collectively controls the gate control system 30, the reference system 60 and the protection system 70 according to the external control signal IN and the external enable signal EN.

For example, the logic device 40 sets the gate control signal S1 to a high level when the external enable signal EN is at a high level (equivalent to a logic level when enabled) and the external control signal IN is at a high level (equivalent to a logic level that turns on the power transistor 10). On the other hand, the logic device 40 sets the gate control signal S1 to a low level when the external enable signal EN is at a low level (equivalent to a logic level when disabled) or the external control signal IN is at a low level (equivalent to a logic level that turns off the power transistor 10).

Moreover, the logic device 40 monitors various signals respectively output from the gate control system 30, the input system 50, the reference system 60 and the protection system 70.

The input system 50 receives a supply of the power supply voltage VDD from the external terminal T1 along a path via the current limiting resistor 92 and operates accordingly. For example, the input system 50 includes an input control circuit 51, an enable control circuit 52, and an under-voltage lockout (UVLO) circuit 53.

The input control circuit 51 receives and transmits an external input of the external control signal IN from the external terminal T3 to the logic device 40. The input control circuit 51 can be, for example, a Schmitt trigger.

The enable control circuit 52 receives and transmits an external input of the external enable signal EN from the external terminal T4 to the logic device 40. The enable control circuit 52 can be, for example, a Schmitt trigger.

The UVLO circuit 53 detects whether a low-voltage anomaly of the power supply voltage VDD has occurred, and transmits the detection result to the logic device 40 and the reference system 60 (particularly a reference generating circuit 61 below). Whether the UVLO circuit 53 is to operate can also be controlled by the enable control circuit 52.

The reference system 60 receives a supply of the power supply voltage VDD from the external terminal T1 along a path via the current limiting resistor 92 and operates accordingly. For example, the reference system 60 includes the reference generating circuit 61 and a negative current detection circuit 62.

The reference generating circuit 61 generates a predetermined reference voltage REF and a predetermined reference current IREF according to the power supply voltage VDD. The reference voltage VREF and the reference current IREF can be, for example, supplied to the gate control system 30.

The negative current detection circuit 62 monitors the output voltage OUT, and detects whether the output current Io flows in a negative direction (equivalent to a direction from the source to the drain of the power transistor 10). The configuration and operation of the negative current detection circuit 62 are described in detail below.

The protection system 70 receives a supply of the power supply voltage VDD from the external terminal T1 along a path via the current limiting resistor 92 and operates accordingly. For example, the protection system 70 includes an overcurrent protection circuit 71, a temperature protection circuit 72 and a load open-circuit detection circuit 73.

The over-current protection circuit 71 monitors the sensing current Is, detects whether an overcurrent anomaly of the output current Io has occurred, and outputs the detection result to the logic device 40. Moreover, the overcurrent protection circuit 71 can also have a function of limiting the output current Io by reducing the gate driving signal G1 during overcurrent detection.

The temperature protection circuit 72 detects whether abnormal heat generation of the semiconductor device 1 has occurred, and outputs the detection result to the logic device 40 and the state output section 80. Moreover, the temperature protection circuit 72 can also have a function of forcibly disconnecting the power transistor 10 by keeping the gate driving signal G1 at a low level during abnormal heat generation detection. In addition, the temperature protection circuit 72 can monitor an element temperature of the power transistor 10, and can also monitor a difference between the temperature of the power transistor 10 and the temperature of other circuit blocks (for example, the logic device 40).

The load open-circuit detection circuit 73 detects whether a load open-circuit of the external terminal T4 has occurred, and outputs the detection result to the logic device 40 and the state output section 80.

The state output section 80 receives a supply of the power supply voltage VDD from the external terminal T1 along a path via the current limiting resistor 92 and operates accordingly. The state output section 80 generates the state signal ST according to the respective detection results of the temperature protection circuit 72 and the load open-circuit detection circuit 73, and externally outputs the state signal ST from the external terminal T6.

Moreover, in addition to the ground voltage GND, a reference voltage GND_REF (with associated details to be described below) is also applied to the various function blocks.

<Electronic Apparatus>

Figure 2:
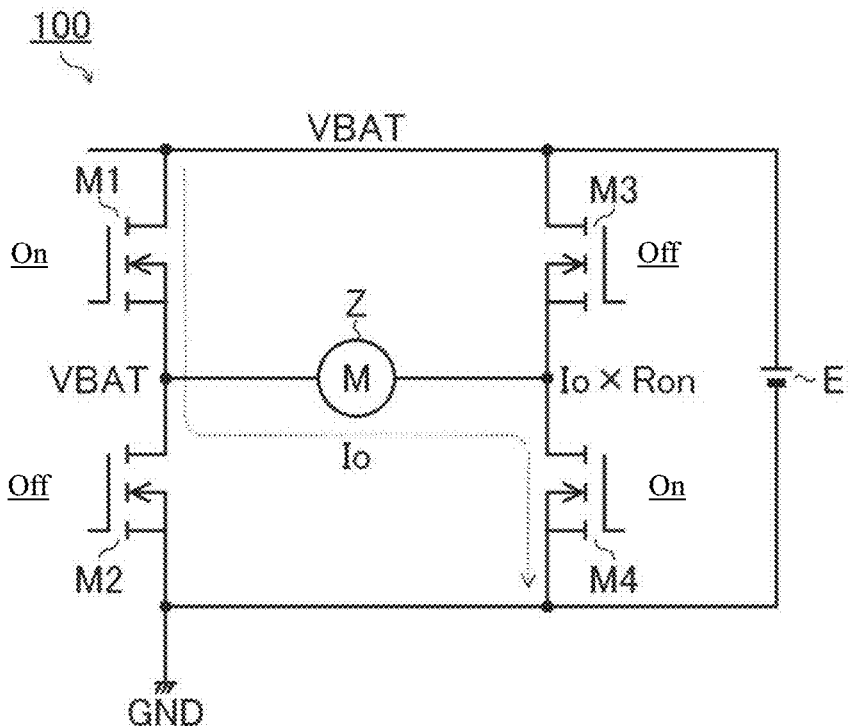
FIG. 2 is a diagram of a configuration example (a first phase) of an electronic apparatus.
Figure 3:
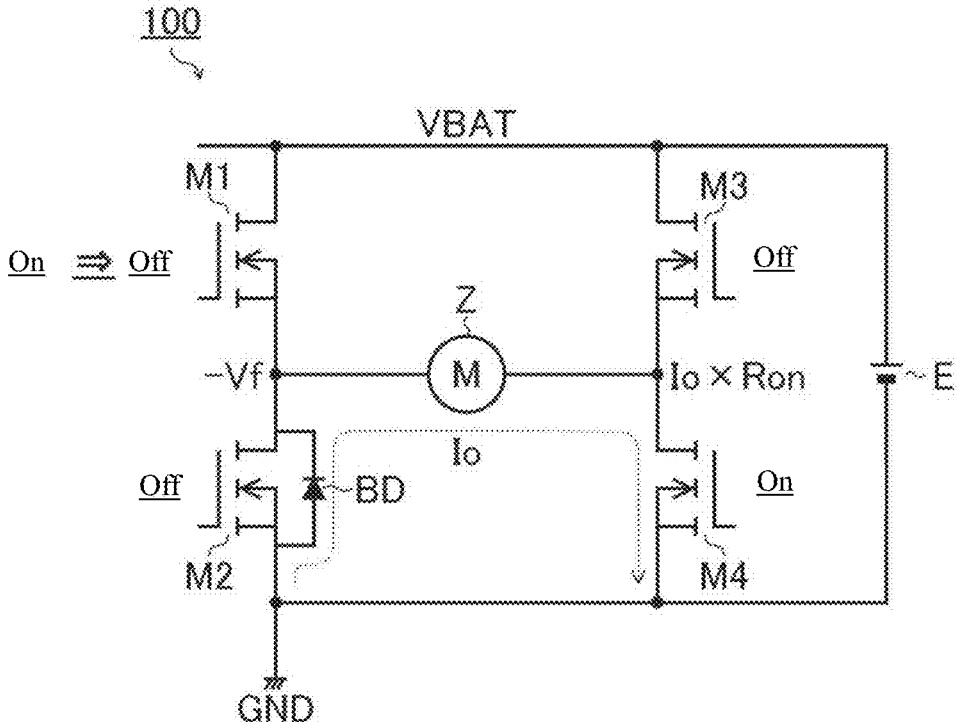
FIG. 3 is a diagram of a configuration example (a second phase) of an electronic apparatus.
Figure 4:
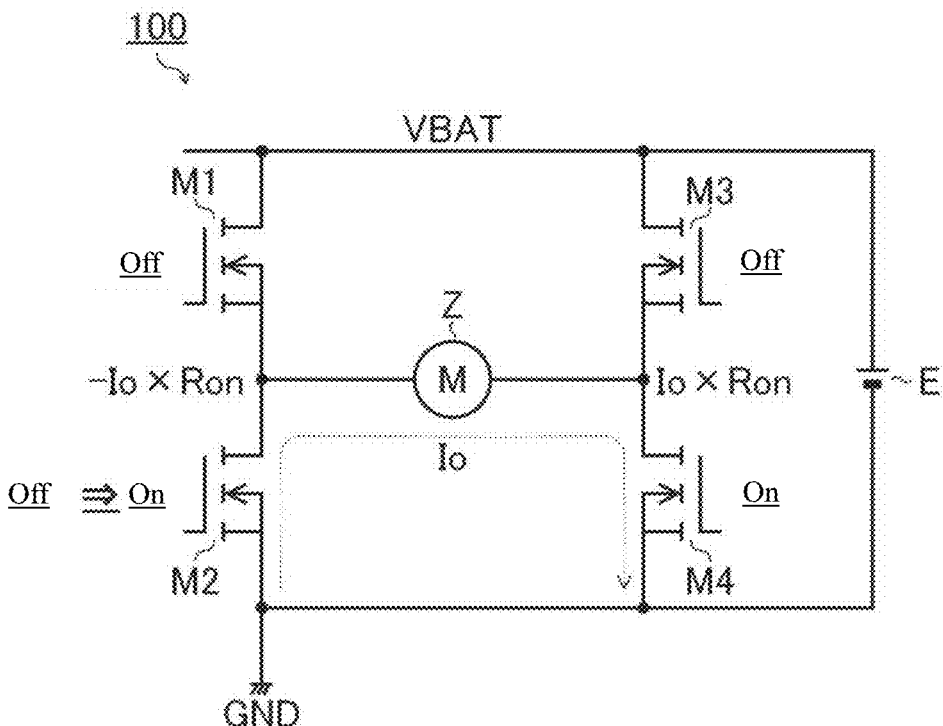
FIG. 4 is a diagram of a configuration example (a third phase) of an electronic apparatus.

FIG. 2 to FIG. 4 show diagrams of a configuration example of an electronic apparatus to which the semiconductor device 1 is applicable. An electronic apparatus 100 of this configuration example has a voltage source E, transistors M1 to M4 (for example, NMOSFETs) and a load Z.

The voltage source E can also be, for example, an in-vehicle battery outputting a battery voltage VBAT.

Both of respective drains of the transistors M1 and M3 are connected to a positive end of the voltage source E (equivalent to an application terminal of the battery voltage VBAT). Both of a source of the transistor M1 and a drain of the transistor M2 are connected to a first end of the load Z. Both of a source of the transistor M3 and a drain of the transistor M4 are connected to a second end of the load Z. Both of respective sources of the transistors M2 and M4 are connected to a negative end of the voltage source E (equivalent to an application terminal of the ground voltage GND).

As such, the transistors M1 to M4 form a full-bridge switch output stage that drives the load Z.

That is to say, the transistors M1 and M2 form a half-bridge switch output stage (a first phase) that drives the first end of the load Z; the transistors M3 and M4 form a half-bridge switch output stage (a second phase) that drives a second end of the load Z.

The semiconductor device 1 described above can be utilized as, for example, the transistor M2 or M4 (or a driving mechanism thereof) which is a low-side switch element of a switch output stage. That is to say, the power transistor 10 described above can be understood as being equivalent to the transistor M2 or M4.

The load Z can also be an inductive load (for example, a coil forming an in-vehicle electric motor).

Moreover, in FIG. 2 to FIG. 4, first to third phases of the electronic apparatus 100 are respectively depicted. The operation states in the drawings are described in detail below.

The first phase (FIG. 2) is equivalent to a rotation state of an electric motor which is the load Z. With reference to this drawing, in the first phase (FIG. 2), both of the transistors M1 and M4 are turned on, and both of the transistors M2 and M3 are turned off. Thus, the output current Io flows in a direction from the application terminal of the battery voltage VBAT through the transistor M1, the load Z and the transistor M4 toward the application terminal of the ground voltage GND. At this point in time, there is no path along which the output current Io flows in a negative direction through the transistor M2. Thus, power consumption CP1 of the transistor M2 is 0.

The second phase (FIG. 3) is equivalent to a dead-zone time of switching from the rotation state to a regeneration state of the electric motor. Such dead-zone time is provided in the aim of preventing an overly large through current from the transistors M1 and M2. With reference to this drawing, by switching from the first phase (FIG. 2) to the second phase (FIG. 3), the transistor M1 is switched from on to off. At this point in time, the output current Io continuously flows through the inductive load Z in a direction same as before. However, both of the transistors M1 and M2 are turned off. Thus, the output current Io flows in a negative direction from the application terminal of the ground voltage GND through a body diode BD included in the transistor M2 toward the load Z. As a result, power consumption CP2 of the transistor M2 is increased (CP2=Io×Vf, where Vf is set as a forward drop voltage of the body diode BD).

The third phase (FIG. 4) is equivalent to the regeneration state. With reference to this drawing, by switching from the second phase (FIG. 3) to the third phase (FIG. 4), the transistor M2 is switched from off to on. At this point in time, the output current Io continuously flows through the inductive load Z in a direction same as that in the second phase (FIG. 3). Moreover, in the third phase (FIG. 4), the transistor M2 is turned on. Thus, the output current Io flows in a negative direction from the application terminal of the ground voltage GND through the transistor M2 toward the load Z. As a result, power consumption CP3 of the transistor M2 is decreased (CP3=Io×Io×Ron, where Ron is set as an on resistance of the transistor M2).

However, when the semiconductor device 1 is used as the transistor M2 or M4, malfunction of a parasitic element may become a problem.

For example, in the second phase (FIG. 3) above, a case where the transistor M2 is a vertical double diffused MOSFET (VDMOSFET) in which an N-type semiconductor substrate is set as a drain is considered. In this case, since the drain voltage of the transistor M2 becomes a negative voltage (−Vf), a parasitic element (a parasitic npn bipolar transistor or a parasitic pn junction diode) included in the semiconductor device 1 can possibly malfunction.

Moreover, due to the malfunction of the parasitic element, the power supply voltage VDD is reduced, or latching is incurred. In particular, during the transition from the second phase (FIG. 3) to the third phase (FIG. 4), power consumption (generated heat) is increased as a result if the transistor M2 is not correctly switched to on.

In view of the consideration above, a negative current detection circuit 62 capable of preventing the malfunction of a parasitic element included in the semiconductor device 1 is proposed below.

<Negative Current Detection Circuit (First Embodiment)>

Figure 5:
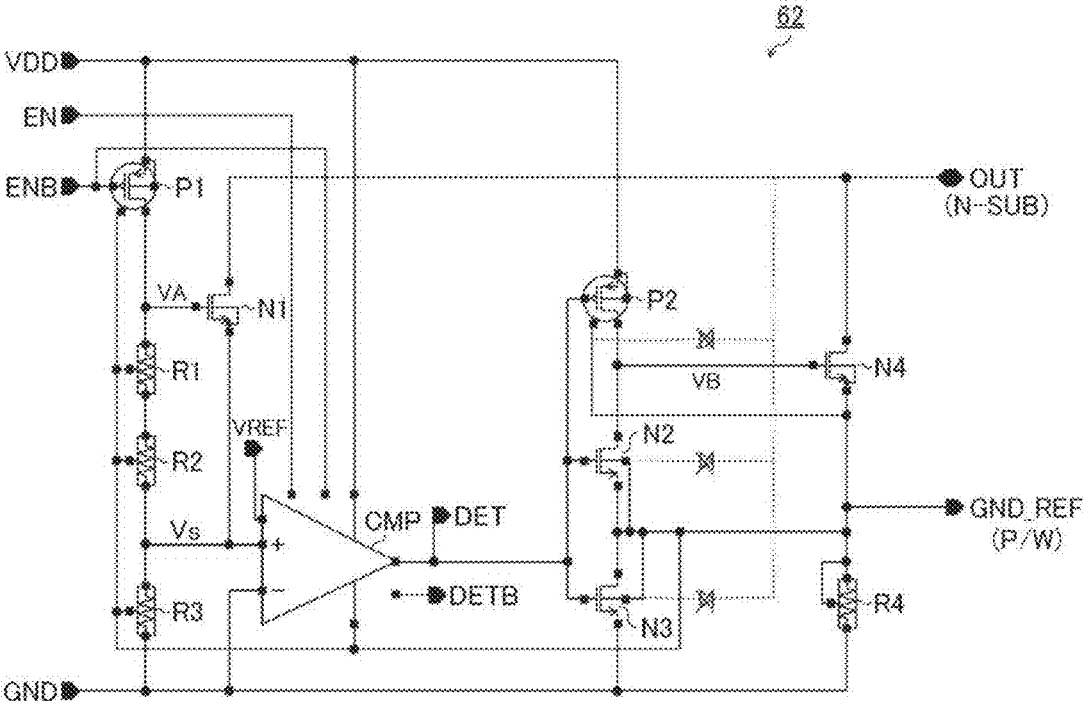
FIG. 5 is a diagram of a negative current detection circuit according to a first embodiment.

FIG. 5 shows a diagram of the negative current detection circuit 62 according to a first embodiment. The negative current detection circuit 62 of this embodiment includes a comparator CMP, transistors N1 to N4 (for example, NMOSFETs), transistors P1 and P2 (for example, PMOS-FETs), and resistors R1 to R4 (for example, semiconductor diffused resistors).

A source and a back gate of the transistor P1 are connected to the application terminal of the power supply voltage VDD. A gate of the transistor P1 is connected to an application terminal of an inverted external enable signal ENB (equivalent to a logically inverted signal of the external enable signal EN). A drain of the transistor P1 is connected to a first end of the resistor R1. A second end of the resistor R1 is connected to a first end of the resistor R2. Both of a second end of the resistor R2 and a first end of the resistor R3 are connected to a non-inverting input terminal (+) of the comparator CMP (equivalent to an application terminal of an output detection voltage Vs). Both of a second end of the resistor R3 and an inverting input terminal (−) of the comparator CMP are connected to the application terminal of the ground voltage GND.

A drain of the transistor N1 is connected to the application terminal of the output voltage OUT (equivalent to an N-type semiconductor substrate N-SUB). A gate of the transistor N1 is connected to a drain of the transistor P1 (equivalent to an application terminal of a node voltage VA). Both of a source and a back gate of the transistor N1 are connected to the non-inverting input terminal (+) of the comparator CMP.

A source and a back gate of the transistor P2 are connected to the application terminal of the power supply voltage VDD. A drain of the transistor P2 is connected to a drain of the transistor N2. All of a source and a back gate of the transistor N2 and a drain and a back gate of the transistor N3 are connected to an application terminal of the reference voltage GND_REF (equivalent to a P-type well P/W). All of the respective gates of the transistors P2, N2 and N3 are connected to an output terminal of the comparator CMP (equivalent to an application terminal of a negative current detection signal DET). A source of the transistor N3 is connected to the application terminal of the ground voltage GND.

A drain of the transistor N4 is connected to the application terminal of the output voltage OUT (equivalent to an N-type semiconductor substrate N-SUB). A gate of the transistor N4 is connected to respective drains of the transistors P2 and N2 (equivalent to an application terminal of a node voltage VB). All of a source and a back gate of the transistor N4 and a first end of the resistor R4 are connected to the application terminal of the reference voltage GND_REF (equivalent to the P-type well P/W). A second end of the resistor R4 is connected to the application terminal of the ground voltage GND.

Moreover, the transistors P1 and P2 and the resistors R1 to R4 are individually formed at the P-type well P/W (equivalent to the application terminal of the reference voltage GND_REF) of the semiconductor device 1. That is to say, the reference voltage GND_REF is applied to the P-type wells P/W and the back gates of the NMOSFETs of all circuit blocks.

The comparator CMP receives a supply of the power supply voltage VDD and operates accordingly. The comparator CMP compares the output detection voltage Vs input to the non-inverting input terminal (+) with the ground voltage GND applied to the inverting input terminal (−) to generate the negative current detection signal DET. Thus, the negative current detection signal DET is at a high level when the output detection voltage Vs is greater than the ground voltage GND and is at a low level when the output detection voltage Vs is less than the ground voltage GND.

Moreover, a predetermined threshold voltage VTH in substitution for the ground voltage GND can also be applied to the inverting input terminal (−) of the comparator CMP. In addition, the comparator CMP can also be controlled according to the external enable signal EN (and the inverted external enable signal ENB) whether to perform the operation above. Moreover, the reference voltage VREF can also be applied to the comparator CMP.

Among the constituting elements, the transistor N3 functions as a first transistor that connects/disconnects the application terminal of the reference voltage GND_REF (equivalent to the P-type well P/W) to/from the application terminal of the ground voltage GND according to the negative current detection signal DET.

The transistor N4 functions as a second transistor that connects/disconnects the application terminal of the reference voltage GND_REF (equivalent to the P-type well P/W) to/from the application terminal of the output voltage OUT according to the negative current detection signal DET.

The transistors P2 and N2 function as inverters that drive the transistor N4 according to the negative current detection signal DET.

The transistors P1 and P2 and the resistors R1 to R3 function as a bias unit that switches between applying the output voltage OUT or a predetermined bias voltage (equivalent to a divided voltage of the power supply voltage VDD) to the non-inverting input terminal (+) of the comparator CMP.

The negative current detection circuit 62 of this embodiment switches between applying the output voltage OUT or the ground voltage GND to the application terminal of the reference voltage GND_REF (equivalent to the P-type well P/W) when the output voltage OUT occurring in the external terminal T4 (equivalent to an output terminal) is detected.

More specifically, when it is detected that the output voltage OUT is less than the ground voltage GND, the negative current detection circuit 62 applies the output voltage OUT to the application terminal of the reference voltage GND_REF (equivalent to the P-type well P/W). On the other hand, when it is detected that the output voltage OUT is greater than the ground voltage GND, the negative current detection circuit 62 applies the ground voltage GND to the application terminal of the reference voltage GND_REF (equivalent to the P-type well P/W).

For example, the output voltage OUT is applied to the application terminal of the reference voltage GND_REF when the output current Io flows in a negative direction and the output voltage OUT becomes a negative voltage (−Vf). That is to say, the N-type semiconductor substrate N-SUB and the P-type well P/W become to have the same voltage. Thus, the malfunction of a parasitic element included in the semiconductor device 1 is prevented. As a result, a decrease in the power supply voltage VDD and latching can be suppressed. In particular, since obstacles are unlikely generated during the transition from the second phase (FIG. 3) to the third phase (FIG. 4), power consumption (generated heat) is suppressed and thus reduced.

Several examples of operation states of the negative current detection circuit 62 are recited and specifically described below.

Figure 6:
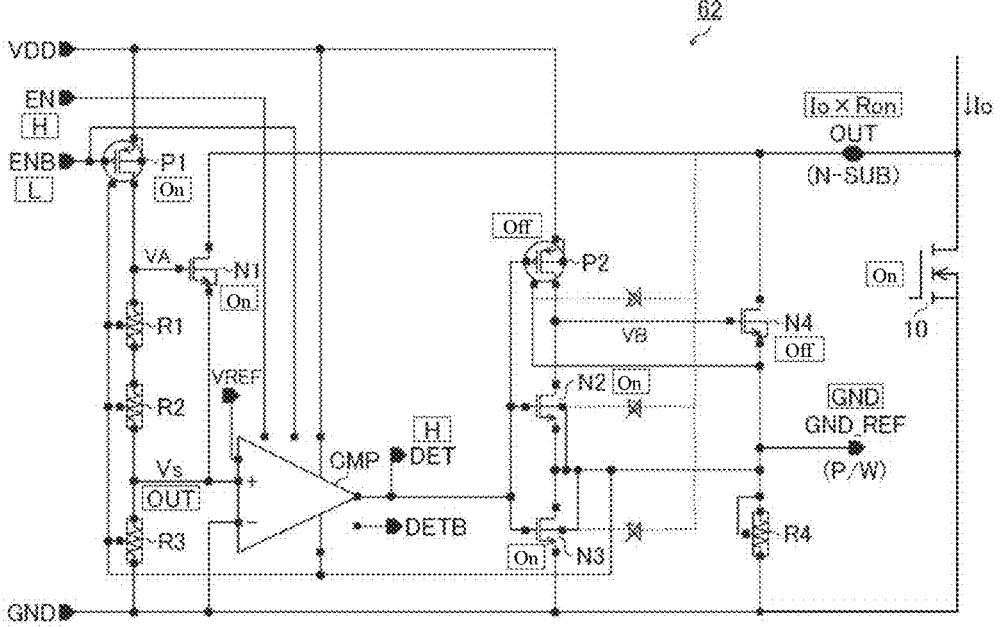
FIG. 6 is a diagram of a first operation state of a negative current detection circuit.

FIG. 6 shows a diagram of a first operation state (an on sequence and a positive current) of the negative current detection circuit 62. In the first operation state, the power transistor 10 is turned on, and the output current Io flows in a positive direction (equivalent to a direction from the drain toward the source of the power transistor 10). At this point in time, the output voltage OUT becomes a positive voltage (equivalent to Io×Ron) determined according to the output current Io and the on resistance Ron of the power transistor 10. Moreover, the first operation state in this drawing is equivalent to the transistor M4 in the first to third phases (FIG. 2 to FIG. 4) in the description above.

When the external enable signal EN is at a high level, that tis, when the inverted external enable signal ENB is at a low level, the transistor P1 is turned on. Thus, the node voltage VA becomes at a high level (≈VDD), and so the transistor N1 becomes turned on. As a result, the output voltage OUT is applied to the non-inverting input terminal (+) of the comparator CMP, as the output detection voltage Vs.

As described above, in the first operation state, because the output voltage OUT becomes a positive voltage (equivalent to Io×Ron) greater than the ground voltage GND, the negative current detection signal DET becomes at a high level. At this point in time, the transistor P2 is turned off and both of the transistors N2 and N3 are turned on. Thus, the node voltage VB becomes at a low level (≈GND), and the transistor N4 becomes turned off. As a result, the reference voltage GND_REF becomes a voltage the same as the ground voltage GND.

Moreover, the output detection voltage Vs in the first operation state becomes in a scale of tens to hundreds of mV. Thus, a low offset of the comparator CMP is desired.

In addition, even if the output voltage OUT becomes a value close to the ground voltage GND, respective resistance values of the resistors R1 to R3 can still be appropriately set by configuring the output detection voltage Vs as reliably greater than the ground voltage GND.

Figure 7:
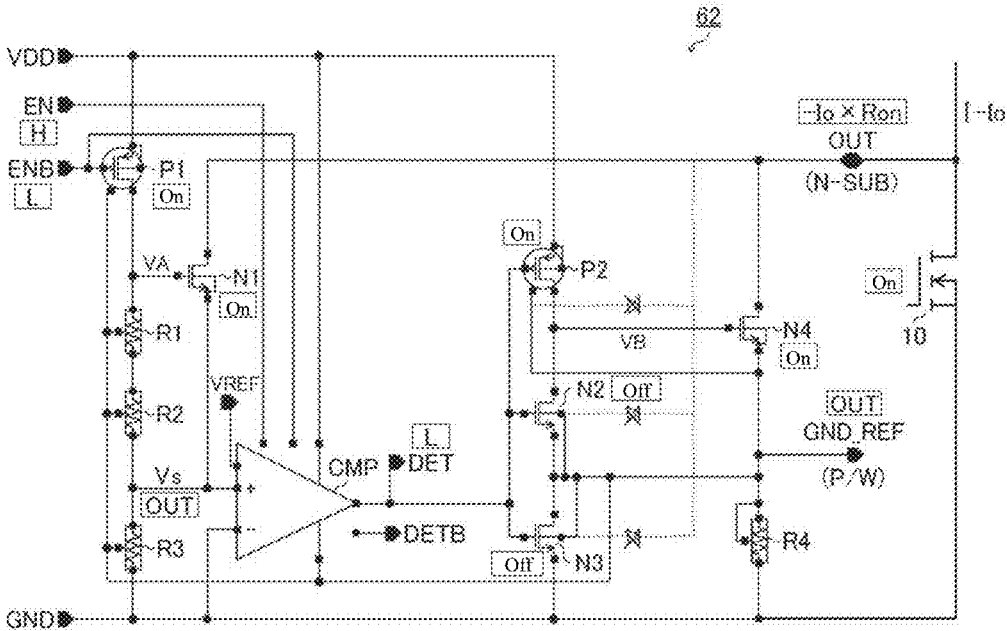
FIG. 7 is a diagram of a second operation state of a negative current detection circuit.

FIG. 7 shows a diagram of a second operation state (an on sequence and a negative current) of the negative current detection circuit 62. In the second operation state, the power transistor 10 is turned on, and the output current Io flows in a negative direction (equivalent to a direction from the source toward the drain of the power transistor 10). At this point in time, the output voltage OUT becomes a negative voltage (equivalent to −Io×Ron) determined according to the output current Io and the on resistance Ron of the power transistor 10. Moreover, the second operation state in this drawing is equivalent to the transistor M2 in the third phase (FIG. 4) in the description above.

In the second operation state, because the output voltage OUT becomes a negative voltage (equivalent to −Io×Ron) less than the ground voltage GND, the negative current detection signal DET becomes at a low level. At this point in time, the transistor P2 is turned on and both of the transistors N2 and N3 are turned off. Thus, the node voltage VB becomes at a high level (≈VDD), and the transistor N4 becomes turned on. As a result, the reference voltage GND_REF becomes a voltage the same as the output voltage OUT.

Moreover, the output detection voltage Vs in the second operation state becomes in a scale of negative tens to negative hundreds of mV. Thus, a low offset of the comparator CMP is desired.

Figure 8:
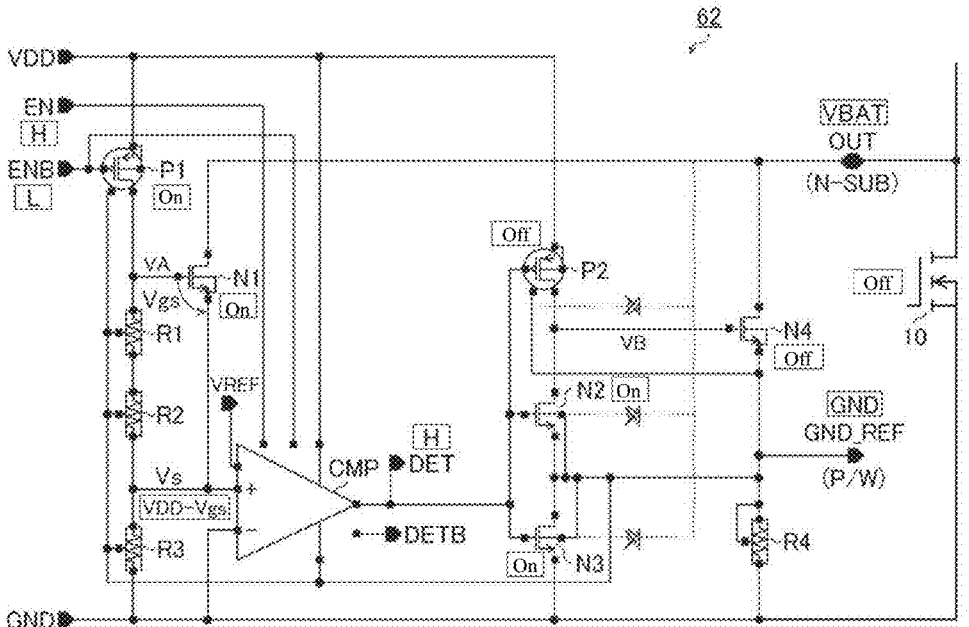
FIG. 8 is a diagram of a third operation state of a negative current detection circuit.

FIG. 8 shows a diagram of a third operation state (an off sequence) of the negative current detection circuit 62. In the third operation state, the power transistor 10 is turned off, and no output current Io flows either in a positive direction or in a negative direction. At this point in time, the output voltage OUT rises to close to the battery voltage VBAT via a high-side switch (for example, the transistor M1 or M3) forming a half-bridge switch output stage. Moreover, the third operation state in this drawing is equivalent to the transistor M2 in the first phase (FIG. 2) in the description above.

In the third operation state, because the output detection voltage Vs is clamped at a positive voltage (≈VDD−Vgs) reduced by the gate-source voltage Vgs of the transistor N1 than the node voltage VA, the negative current detection signal DET becomes at a high level. At this point in time, the transistor P2 is turned off and both of the transistors N2 and N3 are turned on. Thus, the node voltage VB becomes at a low level (≈GND), and the transistor N4 becomes turned off. As a result, the reference voltage GND_REF becomes a voltage the same as the ground voltage GND.

Figure 9:
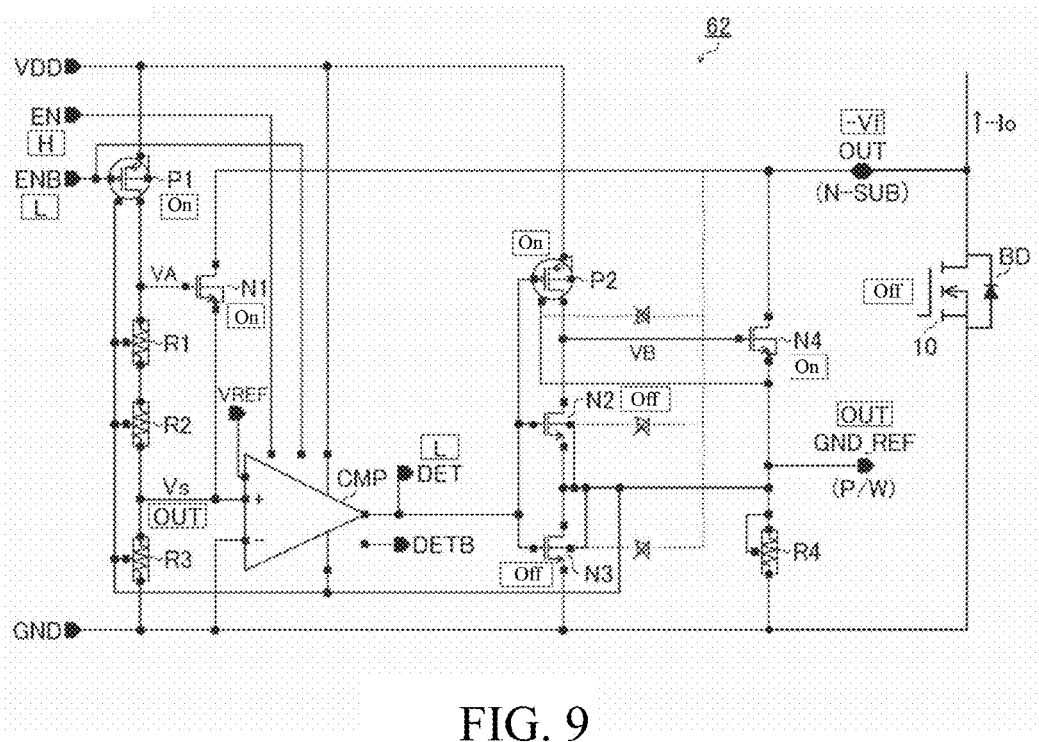
FIG. 9 is a diagram of a fourth operation state of a negative current detection circuit.

FIG. 9 shows a diagram of a fourth operation state (an off sequence and a negative current) of the negative current detection circuit 62. In the fourth operation state, the power transistor 10 is turned off, and the output current Io flows in a negative direction (equivalent to a direction from an anode toward a cathode of the body diode BD included in the power transistor 10). At this point in time, the output voltage OUT becomes a negative voltage (equivalent to −Vf) determined according to a forward drop voltage Vf of the body diode BD. Moreover, the fourth operation state in this drawing is equivalent to the transistor M2 in the second phase (FIG. 3) in the description above.

In the fourth operation state, because the output voltage OUT becomes a negative voltage (equivalent to −Vf) less than the ground voltage GND, the negative current detection signal DET becomes at a low level. At this point in time, the transistor P2 is turned on and both of the transistors N2 and N3 are turned off. Thus, the node voltage VB becomes at a high level (≈VDD), and the transistor N4 becomes turned on. As a result, the reference voltage GND_REF becomes a voltage the same as the output voltage OUT.

<Behaviors when Negative Current is Generated>

Figure 10:
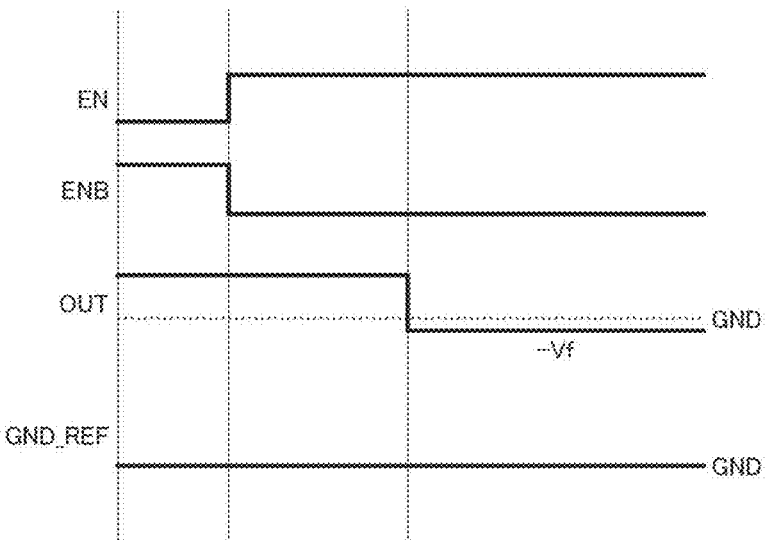
FIG. 10 is a diagram of behaviors when a negative current is generated (in the absence of a negative current detection circuit).

FIG. 10 shows a diagram of behaviors when a negative current is generated (in particular, assuming that no negative current detection circuit 62 is provided). In this drawing, respective behaviors of the external enable signal EN, the inverted external enable signal ENB, the output voltage OUT and the reference voltage GND_REF are depicted sequentially from top to bottom.

As shown in this drawing, assuming that no negative current detection circuit 62 is provided, the reference voltage GND_REF is kept as the ground voltage GND even if the output voltage OUT becomes a negative voltage (−Vf). Thus, as described above, malfunction of a parasitic element included in the semiconductor device 1 is possibly incurred.

Figure 11:
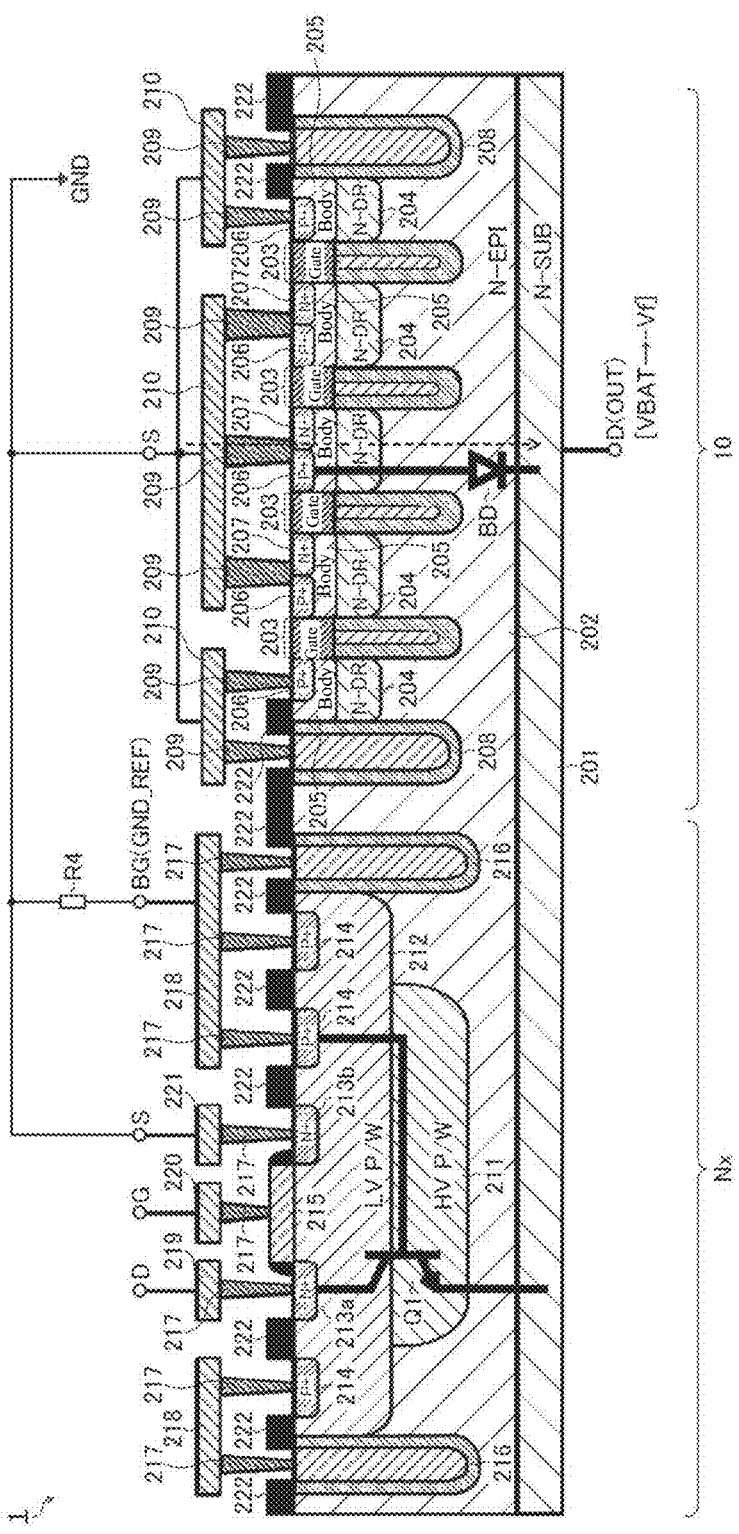
FIG. 11 is a diagram of a longitudinal cross section of a semiconductor device (in the absence of a negative current detection circuit).

FIG. 11 shows a diagram of a longitudinal cross section of the semiconductor device 1 (a drawing for illustrating behaviors when no negative current detection circuit 62 is provided). The semiconductor device 1 includes an N-type semiconductor substrate 201. An N-type epitaxial layer 202 is laminated on the N-type semiconductor substrate 201. Various circuit elements are formed on the N-type epitaxial layer 202. With reference to this drawing, the power transistor 10 (for example, a VDMOSFET) and a transistor Nx (for example, an NMOSFET) are formed on the N-type epitaxial layer 202.

First of all, description is provided by focusing on an element structure of the power transistor 10. In a forming region of the power transistor 10, multiple trench gates 203 are formed at a predetermined interval on the N-type epitaxial layer 202. Moreover, multiple N-type drift regions 204 are buried to respectively surround the multiple trench gates 203 on the N-type epitaxial layer 202.

An N-type body region 205 is formed in an upper layer of the N-type drift region 204. A high-concentration P-type region 206 and a high-concentration N-type region 207 are formed separately in the N-type body region 205. Moreover, the forming region of the power transistor 10 is surrounded by an element separation region 208.

The high-concentration P-type region 206, the high-concentration N-type region 207 and the element separation region 208 are individually in conduction with a metal wiring 210 via a conduction via 209. The metal wiring 210 serves as the source (or the back gate) of the power transistor 10 connected to the application terminal of the ground voltage GND. On the other hand, the N-type semiconductor substrate 201 serves as the drain of the power transistor 10 connected to the application terminal of the output voltage OUT.

Next, description is provided below by focusing on an element structure of the transistor Nx. In a forming region of the transistor Nx, a high withstand voltage P-type well 211 is buried in the N-type epitaxial layer 202. In an upper layer of the high withstand voltage P-type well 211, a low withstand voltage P-type well 212 is formed within a range laterally wider than the high withstand voltage P-type well 211 and reaching a surface layer of the N-type epitaxial layer 202.

High-concentration N-type regions 213a and 213b (equivalent to a drain region and a source region) are formed and spaced apart by a predetermined channel length in the low withstand voltage P-type well 212. Moreover, a high-concentration P-type region 214 (equivalent to a back gate contact) is formed along an outer periphery of the low withstand voltage P-type well 212.

A gate insulating layer 215 is formed in an upper layer of a channel region separated by the high-concentration N-type regions 213a and 213b. Moreover, the forming region of the transistor Nx is surrounded by an element separation region 216.

The high-concentration P-type region 214 and the element separation region 216 are individually in conduction with a metal wiring 218 via a conduction via 217. The metal wiring 218 serves as a back gate (equivalent to the application terminal of the reference voltage GND_REF) of the transistor Nx, and is connected to the application terminal of the ground voltage GND via the resistor R4.

The high-concentration N-type region 213a is in conduction with a metal wiring 219 via the conduction via 217. The metal wiring 219 is equivalent to a drain of the transistor Nx. The gate insulating layer 215 is in conduction with a metal wiring 220 via the conduction via 217. The metal wiring 220 is equivalent to a gate of the transistor Nx. The high-concentration N-type region 213b is in conduction with a metal wiring 221 via the conduction via 217. The metal wiring 221 is equivalent to a source of the transistor Nx, and is connected to the application terminal of the ground voltage GND.

Moreover, apart from a forming region of the conduction via 217, the surface of the N-type epitaxial layer 202 is covered by a protection layer 222.

However, the power transistor 10 having the element structure above includes a body diode BD with the high-concentration P-type region 206 as an anode and the N-type semiconductor substrate 201 and the N-type epitaxial layer 202 as a cathode. In addition, the transistor Nx also includes a parasitic transistor Q1 (equivalent to an npn bipolar transistor) having the high-concentration N-type region 213a as a collector, the N-type semiconductor substrate 201 and the N-type epitaxial layer 202 as an emitter, and the high-concentration P-type region 214, the low withstand voltage P-type well 212 and the high withstand voltage P-type well 211 as a base.

Herein, a case where the body diode BD of the power transistor 10 is in a positive bias state and the output current Io flows through the body diode BD in a negative direction (equivalent to a direction from the application terminal of the ground voltage GND toward the N-type semiconductor substrate 201) is considered. In this case, the output voltage OUT applied to the emitter of the parasitic transistor Q1 becomes a negative voltage ($-Vf<GND$). On the other hand, the reference voltage GND_REF applied to the base of the parasitic transistor Q1 is kept as the ground voltage GND. As a result, there is a concern that the parasitic transistor Q1 becomes turned on.

Figure 12:
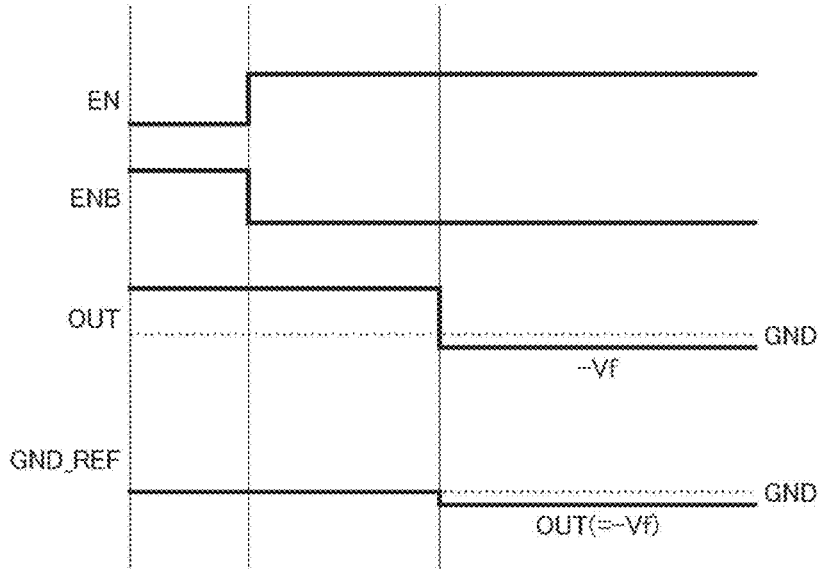
FIG. 12 is a diagram of behaviors when a negative current is generated (in the presence of a negative current detection circuit).

FIG. 12 shows a diagram of behaviors when a negative current is generated (when the negative current detection circuit 62 is provided). In this drawing, similar to the description related to FIG. 10 above, the respective behaviors of the external enable signal EN, the inverted external enable signal ENB, the output voltage OUT and the reference voltage GND_REF are depicted sequentially from top to bottom.

As shown in this drawing, when the negative current detection circuit 62 is provided, the reference voltage GND_REF becomes a voltage the same as the output voltage OUT when the output voltage OUT becomes a negative voltage ($-Vf$). Thus, it is unlikely for malfunction of a parasitic element included in the semiconductor device 1 to occur.

Figure 13:
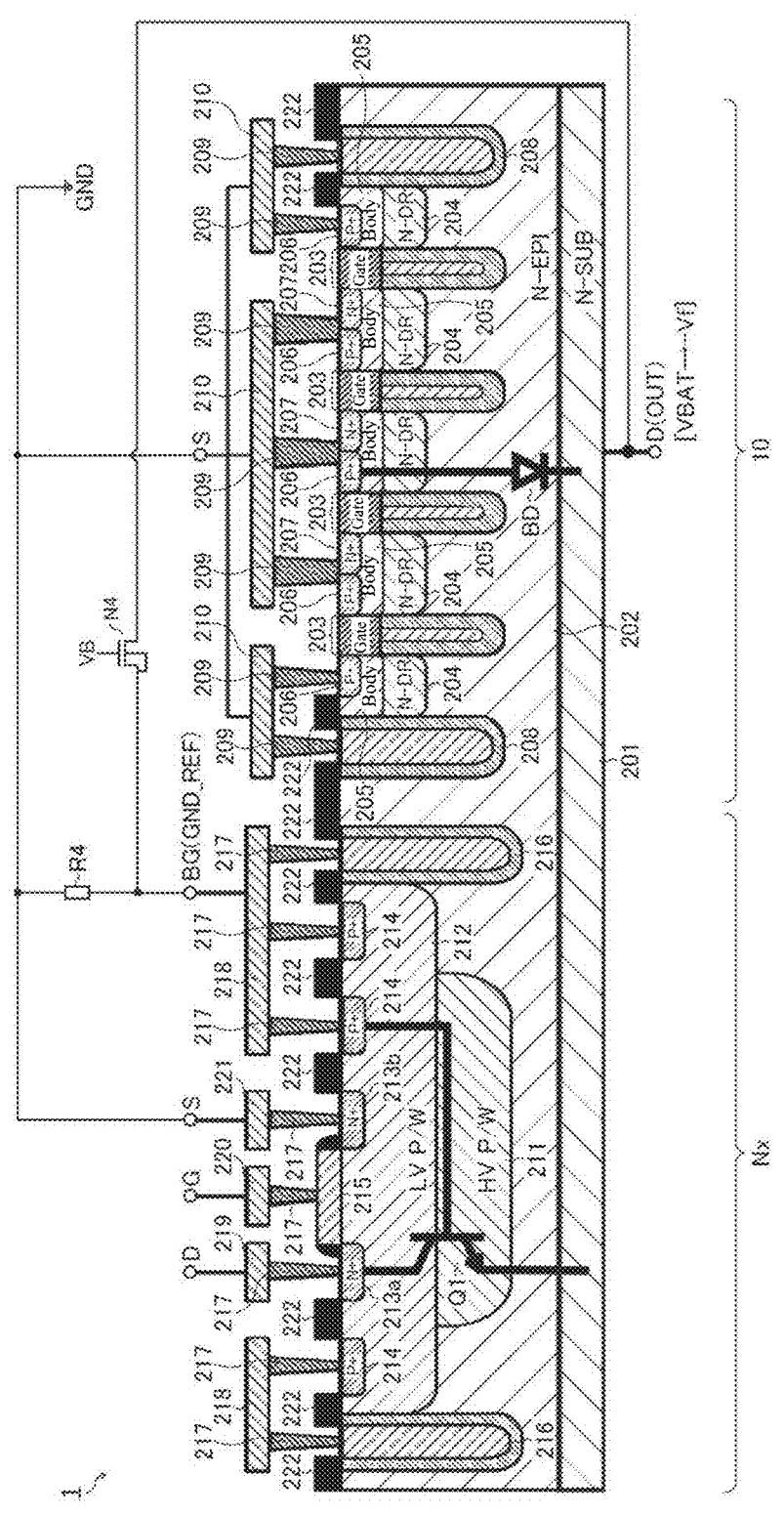
FIG. 13 is a diagram of a longitudinal cross section of a semiconductor device (in the presence of a negative current detection circuit).

FIG. 13 shows a diagram of a longitudinal cross section of the semiconductor device 1 (a drawing for illustrating behaviors when the negative current detection circuit 62 is provided). In this drawing, on the basis of the FIG. 11 above, the transistor N4 arranged between the application terminal of the output voltage OUT and the application terminal of the reference voltage GND_REF is explicitly shown.

When the output current Io flows in a negative direction and the output voltage OUT becomes a negative voltage ($-Vf$), the transistor N4 becomes turned on with the operation of the negative current detection circuit 62. As a result, the reference voltage GND_REF becomes a voltage the same as the output voltage OUT. Thus, a base-emitter voltage (equivalent to GND_REF-OUT) of the parasitic transistor Q1 becomes 0. As a result, unintentionally turning on of the parasitic transistor Q1 can be prevented.

<Observation Related to Characteristics of Output Leakage Current of Negative Current Detection Circuit (First Embodiment)>

However, it is desired that the negative current detection circuit 62 suppresses an output leakage current Io_leak when the output voltage OUT becomes greater than 0 V (Io_leak≈0 µA). Moreover, the output leakage current Io_leak can be defined as a current flowing through the external terminal T4 when an output of the semiconductor device 1 is disconnected, that is, when the power transistor 10 is turned off (in a standby state).

However, in the negative current detection circuit 62 of the first embodiment, there is room for further study on the characteristics of the output leakage current.

Figure 14:
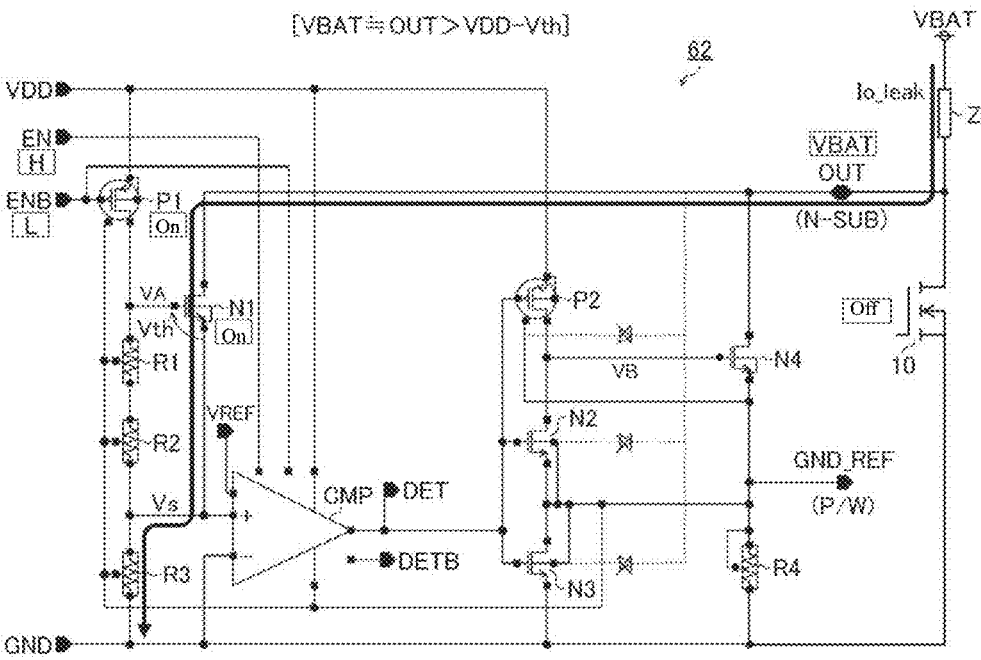
FIG. 14 is a diagram of behaviors when an output is disconnected (a first leakage condition) in a first embodiment.

FIG. 14 shows a diagram of behaviors when an output in the negative current detection circuit 62 of the first embodiment is disconnected (a first leakage condition). Moreover, as the first leakage condition, a case where the battery voltage VBAT (≈output voltage OUT) is greater than a differential voltage VDD-Vth of subtracting an on threshold voltage Vth of the transistor N1 from the power supply voltage VDD (VBAT≈OUT>VDD-Vth) can be assumed.

When the first leakage condition is satisfied, as shown by the arrow in the drawing, the output leakage current Io_leak possibly flows in a positive direction from the application terminal of the output voltage OUT via the transistor N1 and the resistor R3 toward the ground terminal.

At this point in time, no output leakage current Io_leak flows if the transistor N1 is turned off. The transistor N1 is turned off when the gate-source voltage Vgs is less than the on threshold voltage Vth.

Herein, when the first leakage condition is satisfied, between two main electrodes disposed at the transistor N1, the main electrode connected to the application terminal of the output detection voltage Vs functions as the source. That is to say, the gate-source voltage Vgs of the transistor N1 is represented as equation (1) below.

$$Vgs = VA - Vs \qquad (1)$$

Moreover, VA≈VDD. In addition, Vs=VA×R3/(R1+R2+R3). Thus, equation (1) is rewritten to equation (2) below.

$$Vgs \approx VDD \times (R1 + R2)/(R1 + R2 + R3) \qquad (2)$$

It is learned from equation (2) that, in order to set the transistor N1 to off (Vgs<Vth), (R1+R2)<<R3 needs to be satisfied. Thus, in order to suppress the output leakage current Io_leak (set as Io_leak≈0 μA) in a positive direction, R1+R2 needs to be set to a value less than R3. That is to say, characteristics of the output leakage current in a positive direction are improved as R1+R2 decreases.

Figure 15:
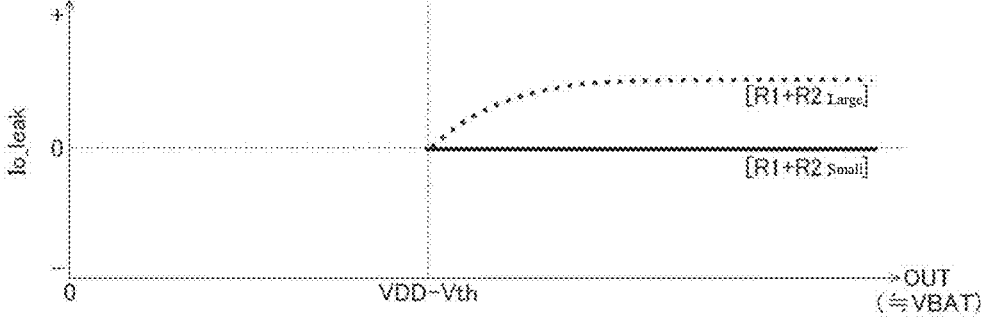
FIG. 15 is a diagram illustrating a relationship between an output voltage and an output leakage current (a first leakage condition) in the first embodiment.

FIG. 15 is a diagram illustrating a relationship between the output voltage OUT and the output leakage current Io_leak in the first embodiment (wherein the first leakage condition is VBAT≈OUT>VDD−Vth).

When R1+R2 is small, it is easier for the transistor N1 to be turned off (as the on resistance is increased) since the gate-source voltage Vgs of the transistor N1 is reduced. Thus, as shown by the solid line in this drawing, the output leakage current Io_leak in a positive direction is suppressed (Io_leak≈0 μA). As such, characteristics of the output leakage current in a positive direction are good when R1+R2 is small.

On the other hand, when R1+R2 is large, it is more difficult for the transistor N1 to be turned off (as the on resistance is decreased) since the gate-source voltage Vgs of the transistor N1 is increased. Thus, as shown by the dotted line in this drawing, the output leakage current Io_leak in a positive direction is possibly increased according to the output voltage OUT. As such, characteristics of the output leakage current in a positive direction are deteriorated when R1+R2 is large.

Figure 16:
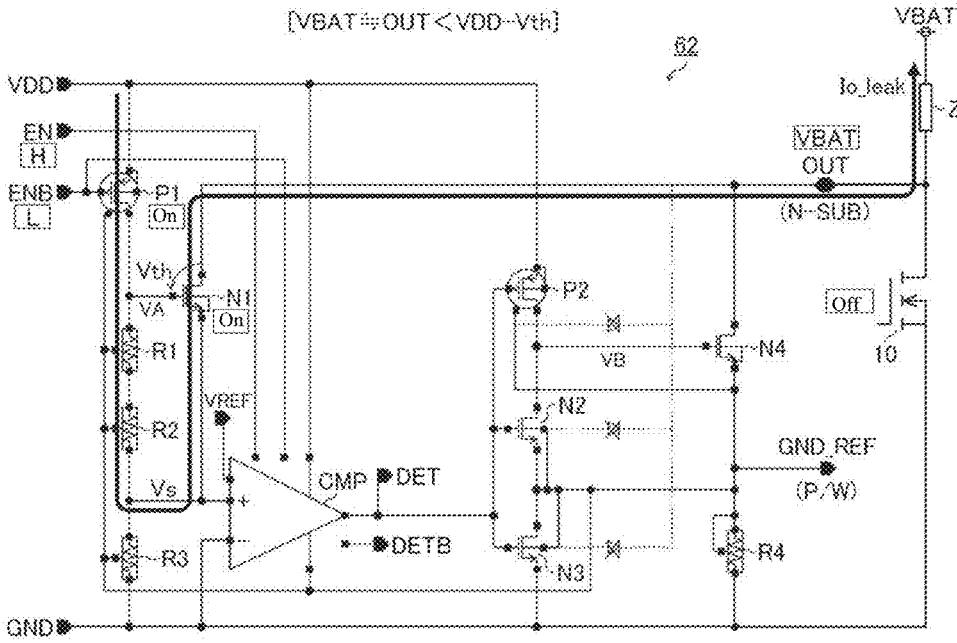
FIG. 16 is a diagram of behaviors when an output is disconnected (a second leakage condition) in the first embodiment.

FIG. 16 shows a diagram of behaviors when an output in the negative current detection circuit 62 of the first embodiment is disconnected (a second leakage condition). Moreover, as the second leakage condition, a case where the battery voltage VBAT (≈output voltage OUT) is less than a differential voltage VDD-Vth of subtracting an on threshold voltage Vth of the transistor N1 from the power supply voltage VDD (VBAT≈OUT<VDD−Vth) can be assumed.

When the second leakage condition is satisfied, between two main electrodes disposed at the transistor N1, the main electrode connected to the application terminal of the output voltage OUT functions as the source. That is to say, the gate-source voltage Vgs of the transistor N1 is represented as equation (3) below.

$$Vgs = VA - OUT \qquad (3)$$

Moreover, VA≈VDD. Thus, when the second leakage condition is satisfied, the transistor N1 can possibly become turned on (Vgs>Vth). Thus, as shown by the arrow in the drawing, the output leakage current Io_leak possibly flows in a negative direction from the application terminal of the power supply voltage VDD via the transistor P1, the resistors R1 and R2 and the transistor N1 toward the application terminal of the output voltage OUT.

Herein, the output leakage current Io_leak in a negative direction is represented by equation (4) below.

$$Io\_leak \approx (VDD - Vs)/(R1 + R2) \qquad (4)$$

Moreover, Vs≈OUT since the transistor N1 is turned on. Thus, equation (4) is rewritten to equation (5) below.

$$Io\_leak \approx (VDD - OUT)/(R1 + R2) \qquad (5)$$

It is learned from equation (5) that, the output leakage current Io_leak in a negative direction is better suppressed as R1+R2 gets larger (Io_leak≈0 μA). That is to say, characteristics of the output leakage current are improved as R1+R2 increases.

Figure 17:
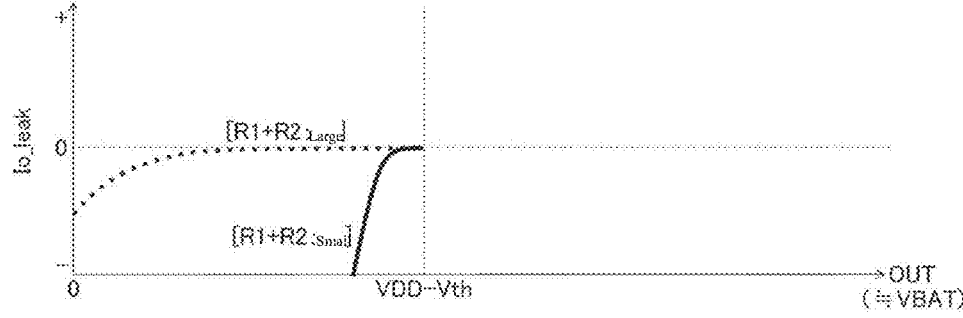
FIG. 17 is a diagram illustrating a relationship between an output voltage and an output leakage current (a second leakage condition) in the first embodiment.

FIG. 17 is a diagram illustrating a relationship between the output voltage OUT and the output leakage current Io_leak in the first embodiment (wherein the second leakage condition is VBAT≈OUT<VDD−Vth).

Thus, as shown by the solid line in this drawing, the output leakage current Io_leak in a negative direction is suppressed (Io_leak≈0 μA) when R1+R2 is large. As such, characteristics of the output leakage current in a negative direction are good when R1+R2 is large.

On the other hand, as shown by the dotted line in this drawing, the output leakage current Io_leak in a negative direction is possibly increased (departing from 0 μA) according to the output voltage OUT when R1+R2 is small. That is to say, characteristics of the output leakage current in a negative direction are deteriorated when R1+R2 is small.

Figure 18:
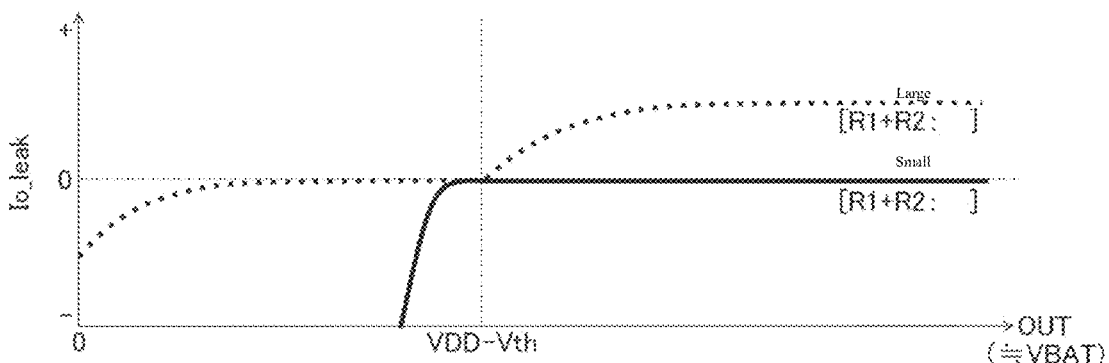
FIG. 18 is a diagram of characteristics of an output leakage current in the first embodiment.

FIG. 18 shows a diagram of characteristics of an output leakage current in the negative current detection circuit 62 in the first embodiment. This drawing can be understood as overlapping FIG. 15 and FIG. 17 described above.

When R1+R2 is small, as shown by the solid line in this drawing, characteristics of the output leakage current in a positive direction are good, and on the contrary, characteristics of the output leakage current in a negative direction are deteriorated. On the other hand, when R1+R2 is large, as shown by the dotted line in this drawing, characteristics of the output leakage current in a negative direction are good, and on the contrary, characteristics of the output leakage current in a positive direction are deteriorated. That is to say, a compromised relationship between the characteristics of the output leakage current in a positive direction and the characteristics of the output leakage current in a negative direction is established.

As such, in the negative current detection circuit 62 of the first embodiment, regardless of the value set for R1+R2, the quality of characteristics of the output leakage current are changed by OUT=VDD-Vth as a border. Thus, when the output voltage OUT is greater than 0 V, it is difficult to achieve the object of suppressing the output leakage current Io_leak (when the output leakage current is set as Io_leak≈0 µA).

In the description below, in view of the above, a second embodiment capable of attending to good characteristics of the output leakage current in both positive and negative directions is proposed.

<Negative Current Detection Circuit (Second Embodiment)>

Figure 19:
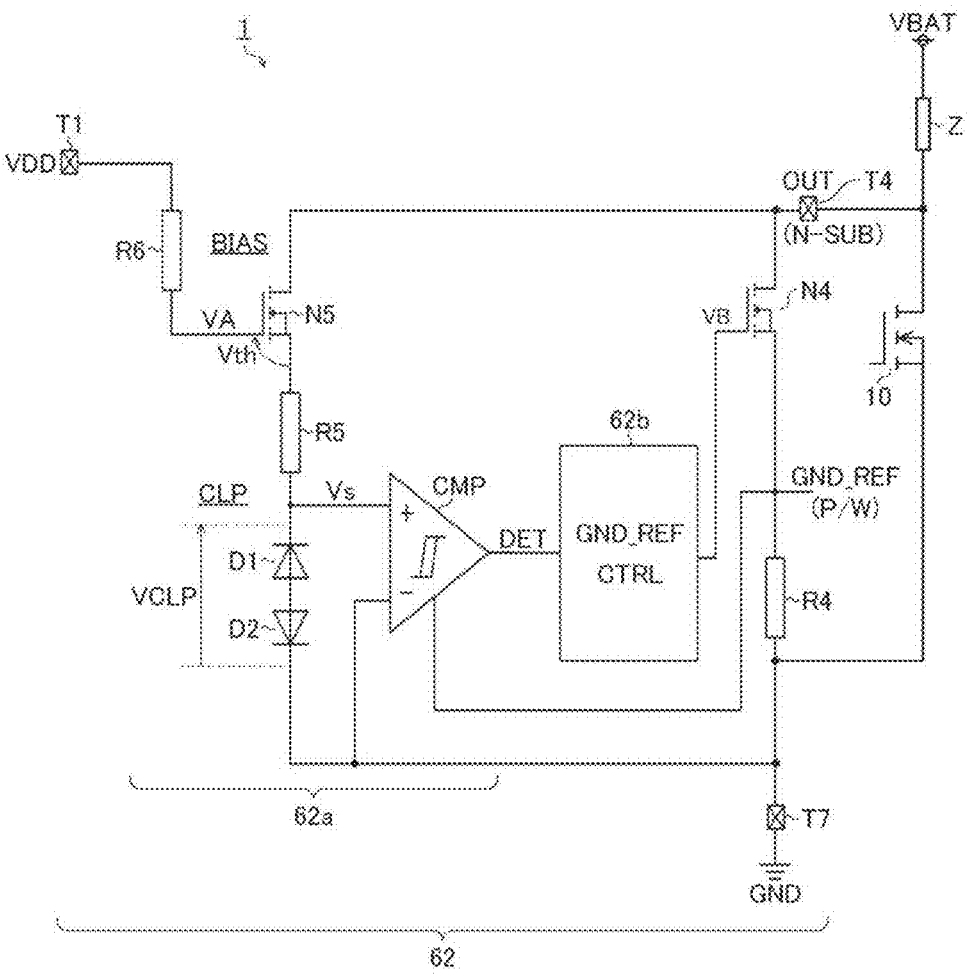
FIG. 19 is a diagram of a negative current detection circuit according to a second embodiment.

FIG. 19 shows a diagram of the negative current detection circuit 62 according to the second embodiment. A circuit structure of the negative current detection circuit 62 of this embodiment is modified on the basis of the first embodiment (FIG. 5) described above. In the description below, the constituting elements previously described are assigned with the same denotations as those in FIG. 5. Repeated description for the constituting elements described above is omitted.

The negative current detection circuit 62 of this embodiment includes a detection signal generating circuit 62a, a reference voltage control circuit 62b, a transistor N4 (for example, an NMOSFET) and a resistor R4. The transistor N4 can also be a VDMOSFET.

The detection signal generating circuit 62a generates a negative current detection signal DET upon detecting that the output voltage OUT appearing at the external terminal T4 is less than the ground voltage GND (or a predetermined threshold voltage) applied to the external terminal T7. With reference to this drawing, in addition to the comparator CMP described above, the detection signal generating circuit 62a further includes a bias circuit BIAS and a clamp circuit CLP.

As described above, the comparator CMP compares the output detection voltage Vs input to the non-inverting input terminal (+) with the ground voltage GND (or the predetermined threshold voltage VTH) input to the inverting input terminal (−) to generate the negative current detection signal DET. With reference to this drawing, the negative current detection signal DET is at a high level when Vs>GND and is at a low level when Vs<GND. Moreover, the comparator CMP can also be a hysteresis comparator.

The bias circuit BIAS switches to applying the output voltage OUT or applying a bias voltage (≈VA−Vth≈VDD−Vth) as the output detection voltage Vs. With reference to this drawing, the bias circuit BIAS further includes a transistor N5 (for example, an NMOSFET), and resistors R5 and R6. The transistor N5 can also be a VDMOSFET.

A drain of the transistor N5 is connected to the external terminal T4 (equivalent to an output terminal). A source of the transistor N5 is connected to a first end of the resistor R5. A second end of the resistor R5 is connected to an application terminal of the output detection voltage Vs. A first end of the resistor R6 is connected to the external terminal T1 (equivalent to an application terminal of the power supply voltage VDD). A second end of the resistor R6 is connected to a gate of the transistor N5.

The resistor R5 is equivalent to a first resistor connected between the source of the transistor N5 and the application terminal of the output detection voltage Vs. The resistor R6 is equivalent to a second resistor connected between the gate of the transistor N5 and the external terminal T1 (equivalent to an application terminal of the power supply voltage VDD). The resistors R5 and R6 respectively function as electrostatic discharge (ESD) protection elements for protecting the non-inverting input terminal (+) of the comparator CMP and the gate of the transistor N5.

The clamp circuit CLP operates when an absolute value of the output detection voltage Vs is greater than a clamp operation voltage VCLP. Thus, an upper limit of the output detection voltage Vs in a positive direction is limited at +VCLP, and an upper limit in a negative direction is limited at −VCLP. That is to say, the clamp operation voltage VCLP can be understood as positive and negative upper limits of the output detection voltage Vs. With reference to this drawing, the clamp circuit CLP includes diodes D1 and D2.

Moreover, a cathode of the diode D1 is connected to the application terminal of the output detection voltage Vs. An anode of the diode D1 is connected to an anode of the diode D2. A cathode of the diode D2 is connected to the external terminal T7 (equivalent to a ground terminal). The diodes D1 and D2 can also be respectively arranged as plural in number in longitudinal rows.

The diode D1 is equivalent to at least one first diode connected with a first polarity between the application terminal of the output detection voltage Vs and the external terminal T7 (equivalent to the ground terminal). The diode D2 is equivalent to at least one second diode connected with a second polarity opposite to the first polarity between the application terminal of the output detection voltage Vs and the external terminal T7 (equivalent to the ground terminal).

It is desired for the clamp operation voltage VCLP to be greater than a differential voltage VA−Vth of subtracting the on threshold voltage Vth of the transistor N5 from the node voltage VA applied to the gate of the transistor N5 (≈VDD−Vth) (with associated details to be described below).

The reference voltage control circuit 62b switches the node voltage VB applied to the gate of the transistor N4 to either a high level or a low level according to the negative current detection signal DET. As such, the reference voltage control circuit 62b switches between applying the ground voltage GND or applying the output voltage OUT to the application terminal of the reference voltage GND_REF (equivalent to the P-type well P/W). Moreover, although not explicitly indicated in this drawing, the reference voltage control circuit 62b can also include, for example, the transistors P2, N2 and N3 (FIG. 5) described above.

The negative current detection circuit 62 of this embodiment, similar to that of the first embodiment (FIG. 5) described above, applies the output voltage OUT to the application terminal of the reference voltage GND_REF (equivalent to the P-type well P/W) upon detecting that the output voltage OUT is less than the ground voltage GND. On the other hand, when it is detected that the output voltage OUT is greater than the ground voltage GND, the negative current detection circuit 62 applies the ground voltage GND to the application terminal of the reference voltage GND_REF (equivalent to the P-type well P/W).

For example, when the output current Io flows in a negative direction and the output voltage OUT changes to a negative voltage (equivalent to −Io×Ron or −Vf), the output detection voltage Vs (≈OUT) is less than the ground voltage GND. Thus, the negative current detection signal DET becomes at a low level. At this point in time, the reference voltage control circuit 62b sets the transistor N4 to be turned on. As a result, the output voltage OUT is applied to the application terminal of the reference voltage GND_REF.

That is to say, the N-type semiconductor substrate N-SUB and the P-type well P/W become to have the same voltage. Thus, the malfunction of a parasitic element included in the semiconductor device 1 is prevented. As a result, a decrease in the power supply voltage VDD and latching can be suppressed. In particular, since obstacles are unlikely generated during the transition from the second phase (FIG. 3)

to the third phase (FIG. 4), power consumption (generated heat) is suppressed and thus reduced.

Moreover, when the output current Io flows in a positive direction and the output voltage OUT changes to a positive voltage (equivalent to Io×Ron), the output detection voltage Vs (≈OUT) is greater than the ground voltage GND. Thus, the negative current detection signal DET becomes at a high level. At this point in time, the reference voltage control circuit 62b sets the transistor N4 to be turned off. As a result, the application terminal of the reference voltage GND_REF is pulled down to the external terminal T7 via the resistor R4. That is to say, the reference voltage GND_REF becomes a voltage the same as the ground voltage GND.

<Observation Related to Characteristics of Output Leakage Current of Negative Current Detection Circuit (Second Embodiment)>

Figure 20:
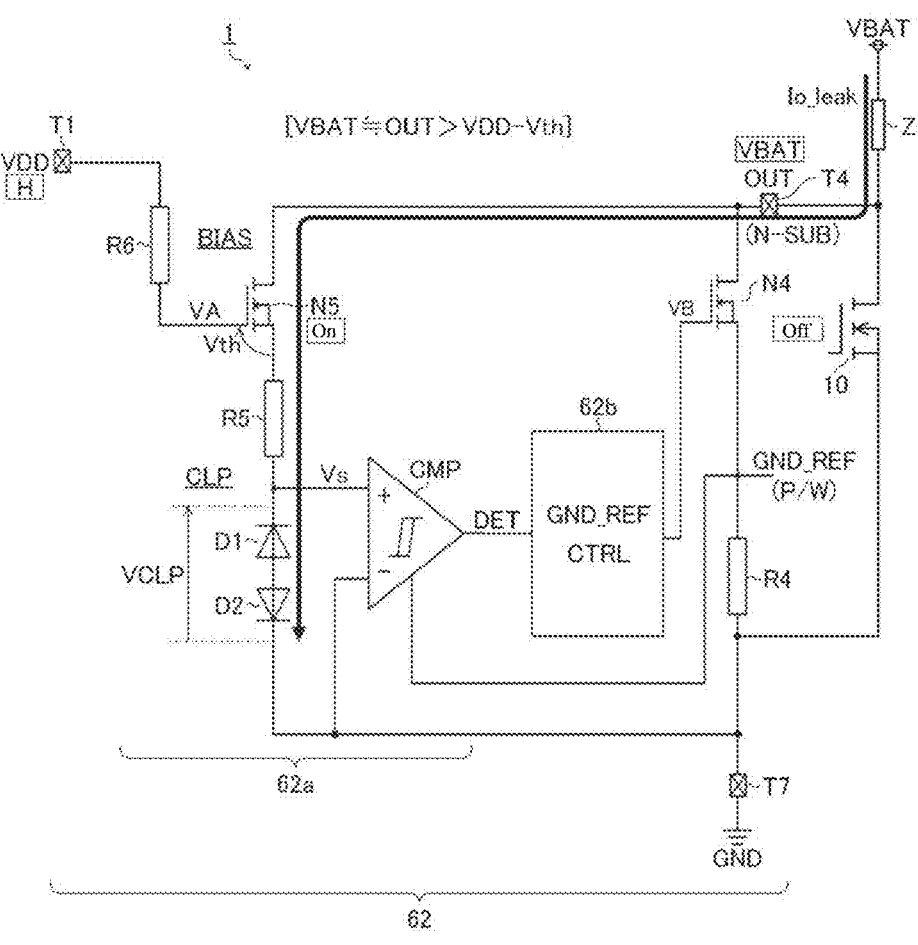
FIG. 20 is a diagram of behaviors when an output is disconnected (a first leakage condition) in the second embodiment.

FIG. 20 shows a diagram of behaviors when an output in the negative current detection circuit 62 of the second embodiment is disconnected (wherein a first leakage condition is VBAT≈OUT>VDD−Vth).

When the first leakage condition is satisfied, as shown by the arrow in the drawing, the output leakage current Io_leak possibly flows in a positive direction from the external terminal T4 (equivalent to an application terminal of the output voltage OUT) via the transistor N5, the resistor R5, the diodes D1 and D2 toward the external terminal T7 (equivalent to an application terminal of the ground voltage GND).

Herein, when the first leakage condition is satisfied, between two main electrodes disposed at the transistor N5, the main electrode connected to the first end of the resistor R5 functions as the source. At this point in time, with the operation of the bias circuit BIAS, the upper limit of the output detection voltage Vs reaches VA−Vth (≈VDD−Vth).

Thus, when VCLP>VDD-Vth, the clamp circuit CLP does not operate. In other words, the clamp circuit CLP does not become a path for conducting the output leakage current Io_leak in a positive direction. Thus, the output leakage current Io_leak in a positive direction is suppressed (Io_leak≈0 μA). That is to say, characteristics of the output leakage current in a positive direction are good.

Figure 21:
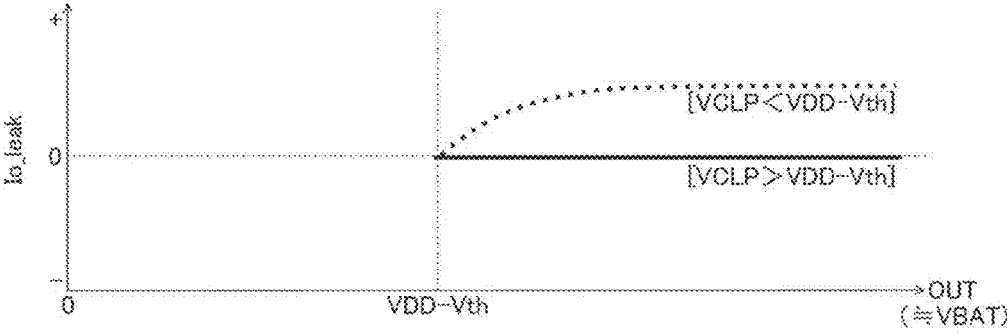
FIG. 21 is a diagram illustrating a relationship between an output voltage and an output leakage current (a first leakage condition) in the second embodiment.

FIG. 21 is a diagram illustrating a relationship between the output voltage OUT and the output leakage current Io_leak in the negative current detection circuit 62 of the second embodiment (wherein the first leakage condition is VBAT≈OUT>VDD−Vth).

When VCLP>VDD-Vth, as described above, the clamp circuit CLP does not operate. Thus, as shown by the solid line in this drawing, the output leakage current Io_leak in a positive direction is suppressed (Io_leak≈0 μA). As such, characteristics of the output leakage current in a positive direction are good when VCLP>VDD−Vth.

On the other hand, the clamp circuit CLP operates when VCLP<VDD−Vth. In other words, the clamp circuit CLP becomes a path for conducting the output leakage current Io_leak in a positive direction. Thus, as shown by the dotted line in this drawing, the output leakage current Io_leak in a positive direction is possibly increased according to the output voltage OUT. As such, characteristics of the output leakage current in a positive direction are deteriorated when VCLP<VDD−Vth.

Figure 22:
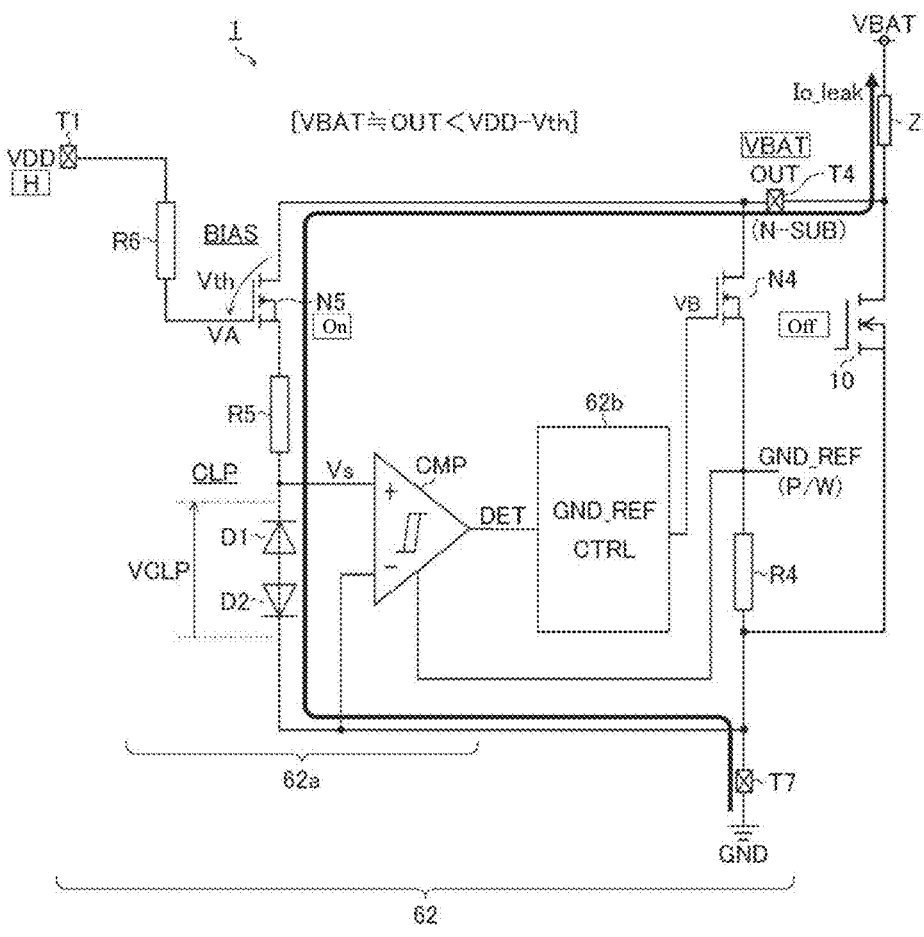
FIG. 22 is a diagram of behaviors when an output is disconnected (a second leakage condition) in the second embodiment.

FIG. 22 shows a diagram of behaviors when an output in the negative current detection circuit 62 of the second embodiment is disconnected (wherein a second leakage condition is VBAT≈OUT<VDD−Vth).

When the second leakage condition is satisfied, between two main electrodes disposed at the transistor N5, the main electrode connected to the external terminal T4 (equivalent to an application terminal of the output voltage OUT) functions as a source. Thus, the transistor N5 is possibly turned on (Vgs>Vth). As shown by the arrow in the drawing, the output leakage current Io_leak possibly flows in a negative direction from the external terminal T7 (equivalent to an application terminal of the ground voltage GND) via the diodes D2 and D1, the resistor R5 and the transistor N5 toward the external terminal T4 (equivalent to the application terminal of the output voltage OUT).

However, if the output detection voltage Vs (≈OUT≈V-BAT) is not reduced to the negative voltage (−VCLP) of the clamp operation voltage VCLP only less than the ground voltage GND, the clamp circuit CLP does not operate. Herein, the lowest value of the battery voltage VBAT is 0 V. Thus, the clamp circuit CLP does not operate. In other words, the clamp circuit CLP does not become a path for conducting the output leakage current Io_leak in a negative direction. Thus, the output leakage current Io_leak in a negative direction does not flow.

Figure 23:
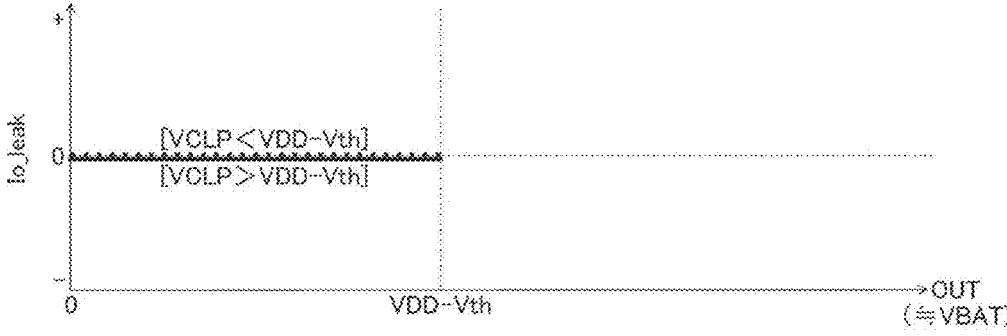
FIG. 23 is a diagram illustrating a relationship between an output voltage and an output leakage current (a second leakage condition) in the second embodiment.

FIG. 23 is a diagram illustrating a relationship between the output voltage OUT and the output leakage current Io_leak in the negative current detection circuit 62 of the second embodiment (wherein the second leakage condition is VBAT≈OUT<VDD−Vth).

As described above, in the second leakage condition, the clamp circuit CLP does not operate even if the battery voltage VBAT is at the lowest value (0 V). Thus, as shown by the solid line and the dotted line in this drawing, the output leakage current Io_leak in a negative direction does not flow regardless of a relationship between the clamp operation voltage VCLP and the differential voltage VDD−Vth. That is to say, characteristics of the output leakage current in a negative direction are always good.

Figure 24:
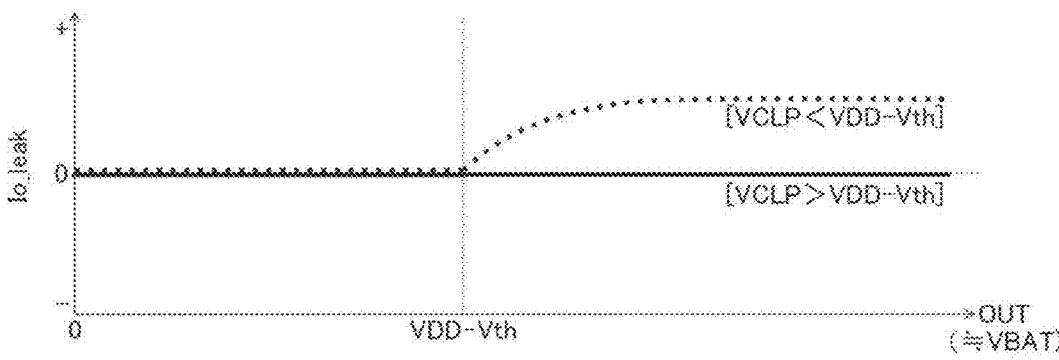
FIG. 24 is a diagram of characteristics of an output leakage current in the second embodiment.

FIG. 24 shows a diagram of characteristics of an output leakage current in the negative current detection circuit 62 of the second embodiment. This drawing can be understood as overlapping FIG. 21 and FIG. 23 described above. As shown by the solid line in this drawing, characteristics of the output leakage current in both a positive direction and a negative direction are good when VCLP>VDD−Vth.

Figure 25:
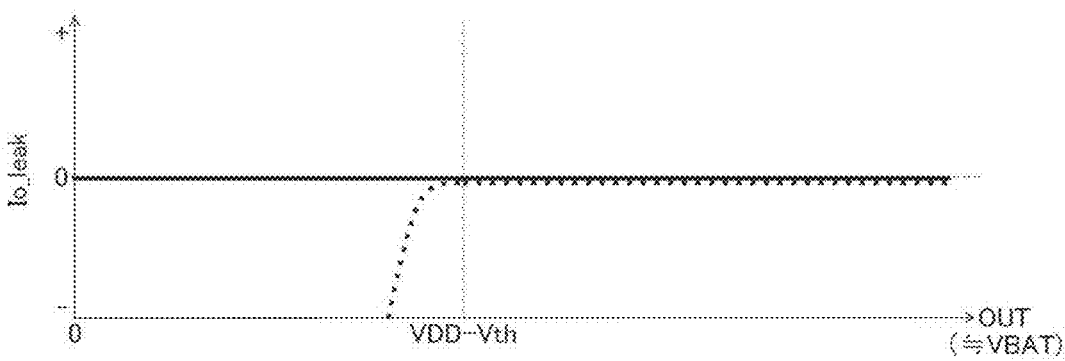
FIG. 25 is a diagram of improved effects in characteristics of an output leakage current.

FIG. 25 shows a diagram of improved effects in characteristics of an output leakage current. In this drawing, as characteristics of the output leakage current in the second embodiment, the solid line (VCP>VDD−Vth) in FIG. 24 is directly depicted as a solid line. Moreover, in this drawing, as characteristics of the output leakage current in the first embodiment, the solid line (wherein R1+R2 is small) in FIG. 18 is depicted as a dotted line.

It is apparent from the comparison between the dotted line and the solid line that, different from the first embodiment (FIG. 18) described above, the negative current detection circuit 62 of this embodiment does not change the quality of characteristics of the output leakage current by using OUT=VDD−Vth as a border. Thus, by appropriately setting the clamp operation voltage VCLP, the object of suppressing the output leakage current Io_leak (when the output leakage current is set as Io_leak≈0 μA) when the output voltage OUT is greater than 0 V can be achieved.

<Application in Vehicle>

Figure 26:
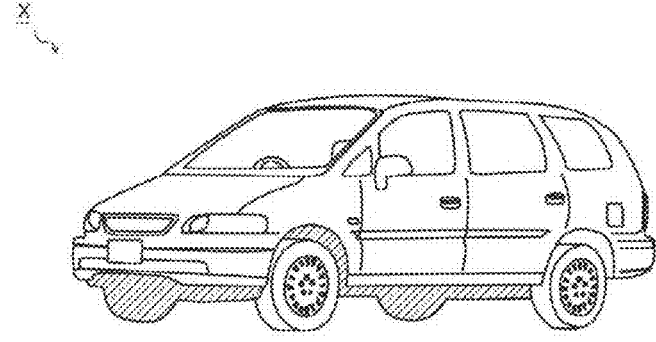
FIG. 26 is a diagram of an appearance of a vehicle.

FIG. 26 shows a diagram of an appearance of a vehicle. A vehicle X of this configuration example is mounted with various electronic apparatuses that receive electrical power from a battery to operate accordingly.

In addition to a motor vehicle, the vehicle X further includes an xEV such as a battery electric vehicle (BEV), a hybrid electric vehicle (HEV), a plug-in hybrid electric vehicle/plug-in hybrid vehicle (PHEV/PHV), or a fuel cell electric vehicle/fuel cell vehicle (FCEV/FCV).

Moreover, the semiconductor device 1 described above can be assembled to any electronic apparatus mounted in the vehicle X.

<Note>

The following is a supplementary note regarding the above disclosure: According to the present disclosure, it is possible to prevent malfunction of a parasitic element.

(Note 1)

A semiconductor device (1), comprising:

a semiconductor substrate (N-SUB) of a first conductivity type;

a well (P/W) of a second conductivity type different from the first conductivity type, formed in the semiconductor substrate (N-SUB);

an output terminal (T4), configured to be electrically connected to the semiconductor substrate (N-SUB);

a ground terminal (T7), configured to receive a ground voltage (GND);

a detection signal generating circuit (62a), configured to generate a negative current detection signal (DET) when an output voltage (OUT) present at the output terminal (T4) is detected to be less than the ground voltage (GND) or a threshold voltage; and a control circuit (62b), configured to switch between applying the ground voltage (GND) or the output voltage (OUT) to the well (P/W) in response to the negative current detection signal (DET), wherein the detection signal generating circuit (62a) includes:

a comparator (CMP), configured to generate the negative current detection signal (DET) by comparing an output detection voltage (Vs) with the ground voltage (GND) or the threshold voltage;

a bias circuit (BIAS), configured to switch between applying the output voltage (OUT) or a bias voltage (VA-Vth) as the output detection voltage (Vs); and a clamp circuit (CLP), configured to operate when an absolute value of the output detection voltage (Vs) is greater than a clamp operation voltage (VCLP).

(Note 2)

The semiconductor device (1) of Note 1, wherein the clamp circuit (CLP) includes:

at least one first diode (D1) connected with a first polarity and between an application terminal of the output detection voltage (Vs) and the ground terminal (T7); and at least one second diode (D2) connected with a second polarity opposite to the first polarity and between the application terminal of the output detection voltage (Vs) and the ground terminal (T7).

(Note 3)

The semiconductor device (1) of Note 1 or 2, wherein the bias circuit (BIAS) includes a first transistor (N5) connected between the output terminal (T4) and an application terminal of the output detection voltage (Vs), and the clamp operation voltage (VCLP) is greater than a differential voltage (VA–Vth) obtained by subtracting an on-threshold voltage (Vth) of the first transistor (N5) from a voltage (VA) applied to a control terminal of the first transistor (N5).

(Note 4)

The semiconductor device (1) of Note 3, wherein the bias circuit (BIAS) further includes a first resistor (R5) connected between a main electrode of the first transistor (N5) and the application terminal of the output detection voltage (Vs).

(Note 5)

The semiconductor device of Note 4, wherein the bias circuit (BIAS) further includes a second resistor (R6) connected between the control terminal of the first transistor (N5) and an application terminal of a power supply voltage (VDD).

(Note 6)

The semiconductor device (1) of any one of Notes 1 to 5, wherein the control circuit (62b) includes:

a second transistor (N3), configured to connect/disconnect the well (P/W) to/from the ground terminal (T7) in response to the negative current detection signal (DET); and a third resistor (R4), connected between the well (P/W) and the ground terminal (T7).

(Note 7)

The semiconductor device (1) of any one of Notes 1 to 6, further comprising a power transistor (10) configured to be connected between the output terminal (T4) and the ground terminal (T7).

(Note 8)

An electronic apparatus (100), comprising:

an inductive load (Z);

a half-bridge or full-bridge switch output stage (M1 to M4), configured to drive the load (Z); and the semiconductor device according to any one of Notes 1 to 7, configured to function as a low-side switch element (M2, M4) of the switch output stage (M1 to M4) or a driving means thereof.

(Note 9)

The electronic apparatus (100) of Note 8, wherein the inductive load (Z) includes a motor.

(Note 10)

A vehicle (X), comprising the electronic apparatus (100) of Note 8 or 9.

<Others>

The various technical features disclosed in this specification can be modified in various ways, in addition to the above-described embodiments, without departing from the spirit of the technical creation. In other words, the above-described embodiments should be considered to be illustrative in all respects and not restrictive. The technical scope of this disclosure is defined by the claims, and should be understood to include all modifications that are equivalent in meaning and scope to the claims.

The invention claimed is:

1. A semiconductor device, comprising:

a semiconductor substrate of a first conductivity type;

a well of a second conductivity type different from the first conductivity type, formed in the semiconductor substrate;

an output terminal, configured to be electrically connected to the semiconductor substrate;

a ground terminal, configured to receive a ground voltage;

a detection signal generating circuit, configured to generate a negative current detection signal when an output voltage present at the output terminal is detected to be less than the ground voltage or a threshold voltage; and a control circuit, configured to switch between applying the ground voltage or the output voltage to the well in response to the negative current detection signal, wherein the detection signal generating circuit includes:

a comparator, configured to generate the negative current detection signal by comparing an output detection voltage with the ground voltage or the threshold voltage;

a bias circuit, configured to switch between applying the output voltage or a bias voltage as the output detection voltage; and a clamp circuit, configured to operate when an absolute value of the output detection voltage is greater than a clamp operation voltage.

2. The semiconductor device of claim 1, wherein the clamp circuit includes:

at least one first diode connected with a first polarity and between an application terminal of the output detection voltage and the ground terminal; and at least one second diode connected with a second polarity opposite to the first polarity and between the application terminal of the output detection voltage and the ground terminal.

3. The semiconductor device of claim 1, wherein the bias circuit includes a first transistor connected between the output terminal and an application terminal of the output detection voltage, and the clamp operation voltage is greater than a differential voltage obtained by subtracting an on-threshold voltage of the first transistor from a voltage applied to a control terminal of the first transistor.

4. The semiconductor device of claim 3, wherein the bias circuit further includes a first resistor connected between a main electrode of the first transistor and the application terminal of the output detection voltage.

5. The semiconductor device of claim 4, wherein the bias circuit further includes a second resistor connected between the control terminal of the first transistor and an application terminal of a power supply voltage.

6. The semiconductor device of claim 1, further comprising:

a second transistor, configured to connect/disconnect the well to/from the ground terminal in response to the negative current detection signal; and a third resistor, connected between the well and the ground terminal.

7. The semiconductor device of claim 1, further comprising a power transistor configured to be connected between the output terminal and the ground terminal.

8. An electronic apparatus, comprising:

an inductive load;

a half-bridge or full-bridge switch output stage, configured to drive the load; and the semiconductor device according to claim 1, configured to function as a low-side switch element of the switch output stage or a driving means thereof.

9. The electronic apparatus of claim 8, wherein the inductive load includes a motor.

10. A vehicle, comprising the electronic apparatus of claim 8.

* * * * *